United States Patent
Hung et al.

(10) Patent No.: US 12,142,494 B2
(45) Date of Patent: Nov. 12, 2024

(54) SMALL GAS FLOW MONITORING OF DRY ETCHER BY OES SIGNAL

(71) Applicant: TAIWAN SEMICONDUCTOR MANUFACTURING COMPANY, LTD., Hsinchu (TW)

(72) Inventors: Po-Lung Hung, Baoshan Township (TW); Yi-Tsang Hsieh, Hsinchu (TW); Yu-Hsi Tang, Yunlin County (TW); Chih-Teng Liao, Hsinchu (TW); Chih-Ching Cheng, Xizhou Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 587 days.

(21) Appl. No.: 17/341,367

(22) Filed: Jun. 7, 2021

(65) Prior Publication Data

US 2022/0392785 A1 Dec. 8, 2022

(51) Int. Cl.
*H01L 21/67* (2006.01)
*H01J 37/32* (2006.01)

(52) U.S. Cl.
CPC .. *H01L 21/67069* (2013.01); *H01J 37/32449* (2013.01); *H01J 37/32972* (2013.01); *H01L 21/67253* (2013.01); *H01J 2237/24507* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,658,423 A | * | 8/1997 | Angell | H01J 37/3299 700/121 |
| 5,871,658 A | * | 2/1999 | Tao | B24B 37/013 216/60 |
| 6,060,328 A | * | 5/2000 | En | H01L 22/26 216/60 |
| 6,514,375 B2 | * | 2/2003 | Kijima | H01J 37/32935 156/345.25 |
| 6,635,185 B2 | * | 10/2003 | Demmin | H01L 21/32137 257/E21.252 |

(Continued)

FOREIGN PATENT DOCUMENTS

| CN | 111800929 A | 10/2020 |
|---|---|---|
| TW | 200403704 A | 3/2004 |

(Continued)

OTHER PUBLICATIONS

Machine English translation of TW-201037779-A; (Year: 2010).*

*Primary Examiner* — Shamim Ahmed
(74) *Attorney, Agent, or Firm* — STUDEBAKER & BRACKETT PC

(57) ABSTRACT

In a method of controlling a plasma beam of a plasma etcher a flow rate controller of the plasma etcher is set to generate one or more flow rates of an etching gas corresponding to one or more plasma beams of the plasma etcher. The emitted light generated by plasma discharge corresponding to the one or more plasma beams of the plasma etcher is monitored. The flow rate controller is calibrated based on the one or more flow rates and a corresponding emitted light of the plasma discharge.

20 Claims, 20 Drawing Sheets

700

Set a flow rate controller of a plasma etcher to generate one or more flow rates of an etch gas of the plasma etcher  S710

Monitor emitted light from plasma discharge of the plasma etcher  S720

Calibrate the flow rate controller of a plasma etcher based on the one or more flow rates and the corresponding emitted light of the plasma discharge S730

(56) References Cited

U.S. PATENT DOCUMENTS

2009/0103081 A1* 4/2009 Whelan .................... G01J 3/28
356/243.1
2019/0333742 A1* 10/2019 Matsuda ........... H01L 21/02219
2020/0105510 A1 4/2020 Yoshida et al.

FOREIGN PATENT DOCUMENTS

TW 201037779 A * 10/2010 ............. G01N 21/68
TW 202023326 A 6/2020

* cited by examiner

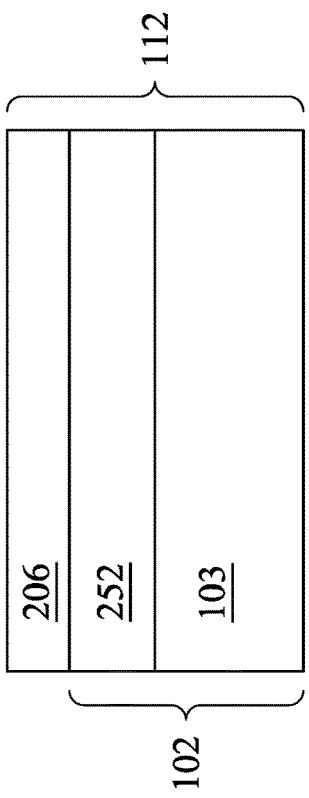
FIG. 2A
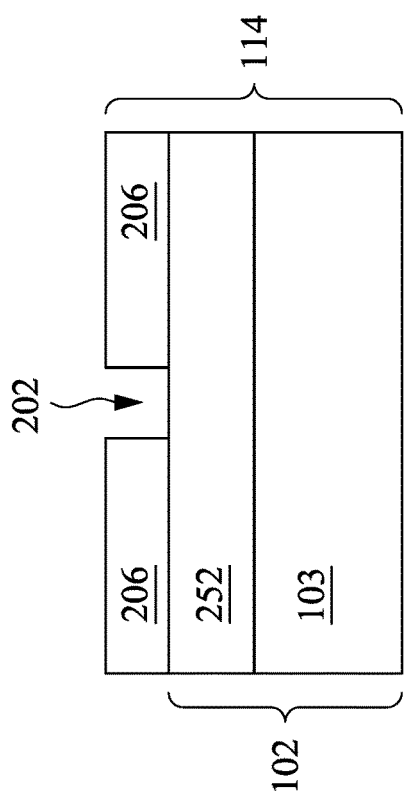
FIG. 2C
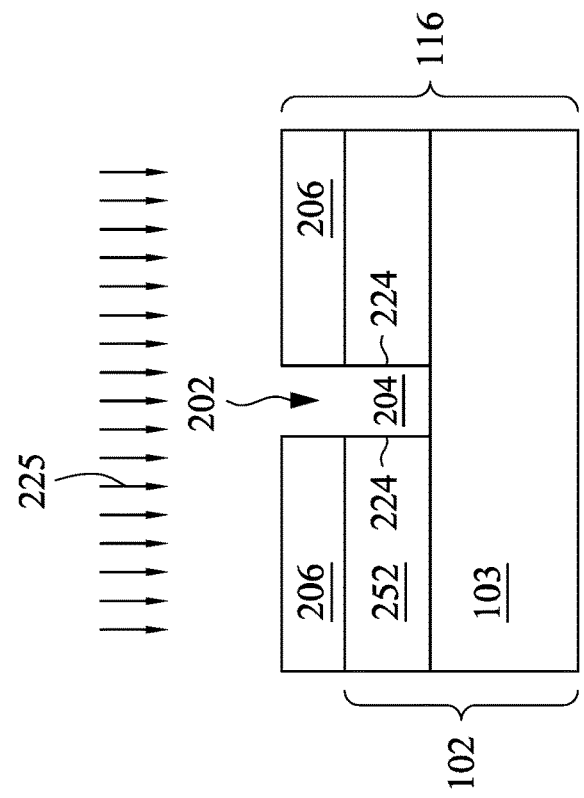
FIG. 2B
FIG. 2D

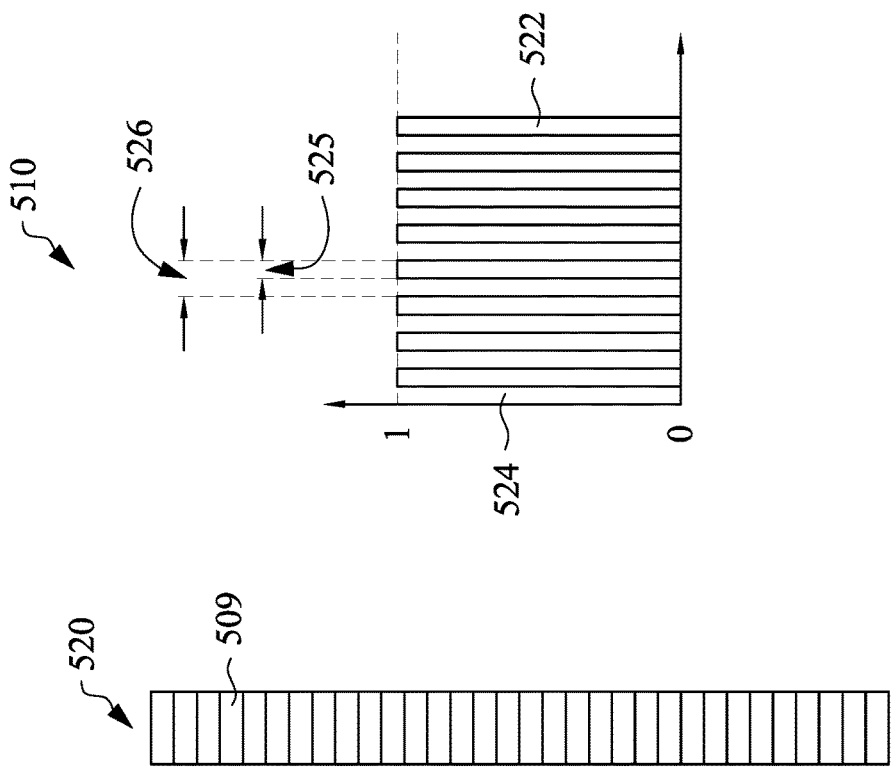
FIG. 5C
FIG. 5B
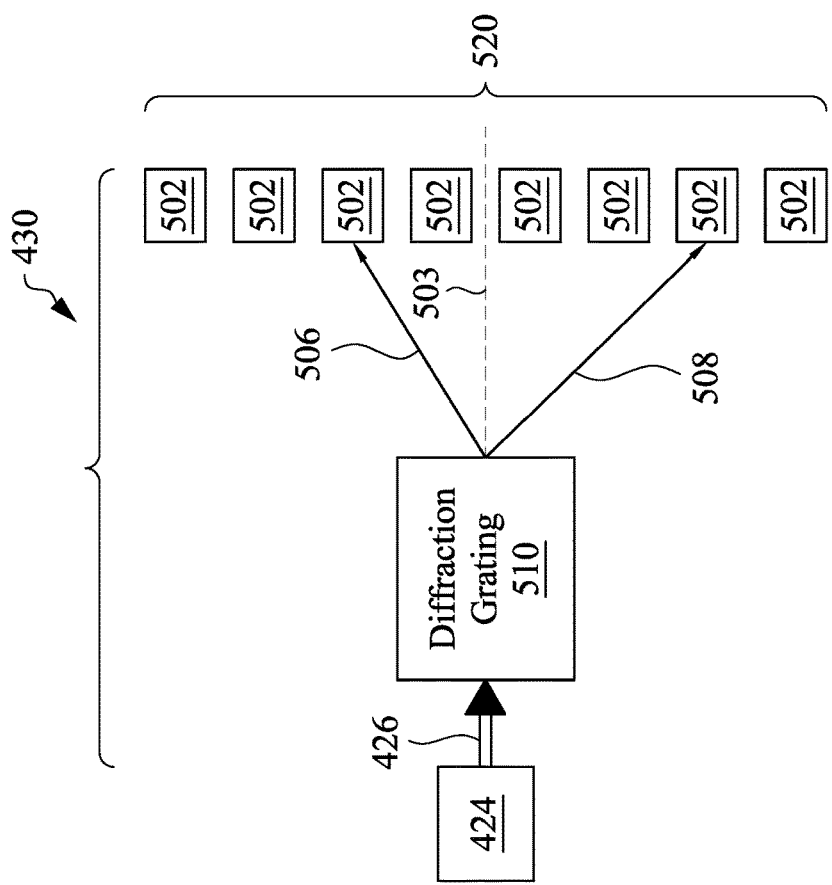
FIG. 5A

SMALL GAS FLOW MONITORING OF DRY ETCHER BY OES SIGNAL

BACKGROUND

During an integrated circuit (IC) design, a number of layout patterns of the IC, for different steps of IC processing, are generated on a substrate. The layout patterns include geometric shapes corresponding to structures to be fabricated on the substrate. The geometric shapes may be produced by dry etching, e.g., by plasma etching with a plasma beam, of a top layer on the substrate to produce the shapes. In addition, the shapes may be fine-tuned by dry etching. Therefore, it is desirable to control the intensity of the plasma beam to produce exact shapes of the patterns on the substrate.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C, and 2D show a schematic diagram of steps of etching a semiconductor device in accordance with some embodiments of the present disclosure.

FIGS. 5A 5B, and 5C show a diffraction grating system for differentiating multiple wavelengths of an incident light beam, a light detector array, and a grating structure in accordance with some embodiments of the present disclosure.

DETAILED DESCRIPTION

Figure 1:
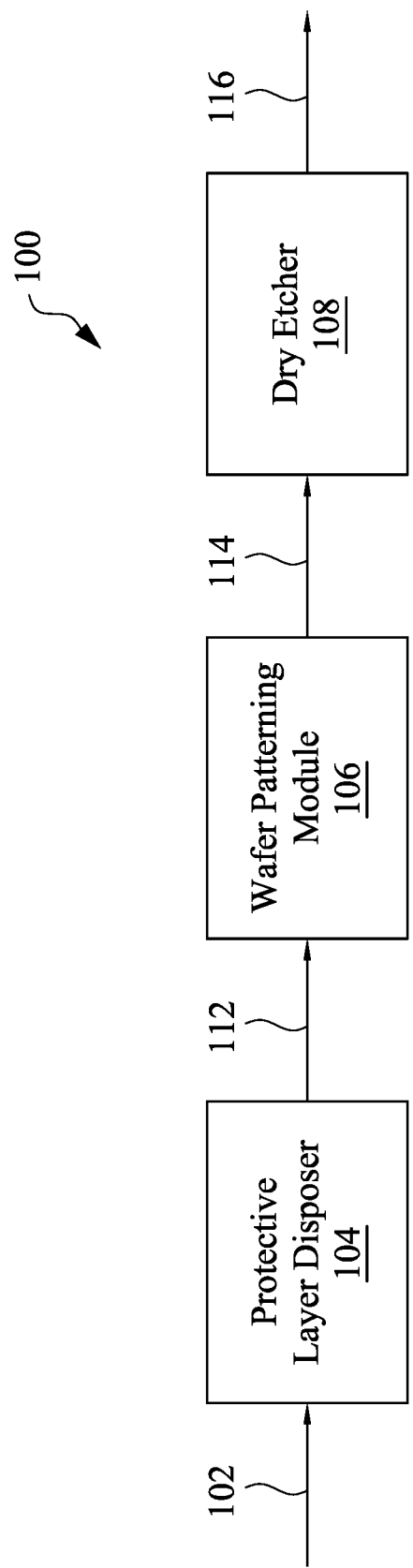
FIG. 1 shows an exemplary process for etching a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In a plasma dry etching process, one or more etching gases are provided to a plasma etcher. The etching gas is converted into a plasma inside the plasma etcher and the converted plasma is directed as a plasma beam to a substrate for plasma etching, e.g., dry etching. In some embodiments, the intensity of the plasma beam is determined, e.g., calculated, based on the flow rate of the etching gas that enters the plasma etcher. Therefore, the intensity of the plasma beam is controlled by adjusting the flow rate of the etching gas that enters the plasma etcher. Generally, the flow rate of the etching gas is increased to increase the intensity of plasma beam and to increase the etching rate of dry etching. Conversely, the flow rate of the etching gas is decreased to decrease the intensity of plasma beam and to decrease the etching rate of dry etching. In some embodiments, when the flow rate of the etching gas that enters the plasma etcher is below a specific flow rate, the relation between the plasma beam intensity and the flow rate of the etching gas is not linear and the flow controller of the plasma etcher needs recalibration for low flow rates. In some embodiments, the recalibration is performed by consecutively setting a flow rate controller to a series of flow rates, e.g., a series of increasing or decreasing low flow rates.

In some embodiments, the plasma etcher includes therein a dry etching chamber. The dry etching chamber has a substrate stage on which a semiconductor wafer or substrate is loaded. The plasma beam of the plasma etcher that is generated by a plasma beam generator of the plasma etcher is directed to the substrate for dry etching. The plasma beam interacts with the substrate and produces plasma discharge by the interaction of the plasma beam with the substrate. The plasma discharge generates emitted light and a known portion of the emitted light produced by the plasma interactions is received by a light detector system attached to the dry etching chamber. The light detector system uses an optical emission spectroscopy (OES) to detect the emitted light associated with the plasma discharge. In some embodiments, the detected emitted light from the plasma discharge is proportional to the intensity of the plasma beam generated in the plasma etcher. Thus, the flow rate controller of the plasma etcher is recalibrated for the low flow rates based on the detected emitted light associated with the series of low flow rates.

FIG. 1 shows an exemplary process 100 for etching a semiconductor device. A protective layer is disposed over an initial substrate 102, on which a target layer to be patterned or etched is formed, by a protective layer disposer 104 to generate a substrate 112. In some embodiments, the protective layer is a soft mask, e.g., a photoresist layer. In some embodiments, instead of a photoresist material, the protective layer is made of a hard mask layer of a material used in semiconductor processing as an etch mask and the hard mask layer that is deposited by chemical vapor deposition (CVD). In some embodiments, the hard mask used for dry etching process is an insulating material, such as, silicon oxide, silicon nitride, SiON, silicon carbide (SiC), tantalum pentoxide ($Ta_2O_5$), aluminum oxide or aluminum nitride (AlN). In other embodiments, the hard mask is made of amorphous silicon, polysilicon, titanium nitride or any other conductive material. In some embodiments, the soft mask or the hard mask is patterned by a wafer patterning module 106, e.g., by a lithographic system, and portions of the soft mask or the hard mask are removed to create a pattern in the soft mask or the hard mask. Thus, the wafer patterning module 106 generates a pattern-masked substrate 114. The pattern-masked substrate 114 is etched by a dry etcher 108, e.g., a plasma etcher, and the substrate under the removed portions of the soft mask or the hard mask are etched while the remaining portions of the soft mask or the hard mask is used to prevent etching. The dry etcher 108 produces an etched substrate 116. The process 100 is described in more details with respect to FIGS. 2A, 2B, 2C, and 2D.

FIGS. 2A, 2B, 2C, and 2D show a schematic diagram of sequential steps of etching a semiconductor device in accordance with some embodiments of the present disclosure. It is understood that additional operations can be provided before, during, and after processes shown by FIGS. 2A-2D, and some of the operations described below can be replaced or eliminated, for additional embodiments of the method. The order of the operations/processes may be interchangeable. FIG. 2A shows the initial substrate 102, e.g., a wafer, of FIG. 1 with a base substrate 103 and an insulator layer 252 disposed over the base substrate 103. A protective layer 206 is deposited over the initial substrate 102 and the substrate 112 is produced as shown in FIG. 2B. In some embodiments, the protective layer 206 is a photo resist layer. In some embodiments, the protective layer 206 is a hard mask layer described above. As shown in FIG. 2C, the protective layer 206 is patterned and an opening 202 is produced in the protective layer 206 that exposes the initial substrate 102 and produces the substrate 114. When the protective layer is a photo resist layer, the opening 202 is produced by a lithographic process of imaging a photo mask, developing the photo resist layer, and removing the photo resist in the opening 202. When the protective layer 206 is a hard mask, a photo resist layer (not shown) is coated on top of the protective layer 206. The photo resist layer is patterned and the photo resist layer over the opening 202 is removed by the lithographic process described above. Then, the opening 202 is created in the protective layer 206 by one or more etching operations.

In some embodiments, as shown in FIG. 2D, a low intensity plasma beam 225 of a plasma etcher is directed to the substrate 114. In some embodiments, the low intensity plasma beam 225 that is generated by a low flow rate of etching gas provided to a plasma etcher, does not etch the protective layer 206 but etches the initial substrate 102 and creates a via 204 with straight edges 224 in the initial substrate 102 and generates an etched substrate 116. As shown in FIG. 2D, the low intensity plasma beam 225 produces the via 204 with straight edges 224 all the way through the insulator layer 252. In some embodiments, the via 204 is filled with a conductive material and an electrical connection is produced between the top surface of the insulator layer 252 and the bottom surface of the insulator layer. In some embodiments, the via 204 is etched all the way through the initial substrate 102 and the via 204 is filled with a conductive material and is used for producing an electrical connection with the backside of the initial substrate 102, e.g., with the backside of the wafer. In some embodiments, using a lower intensity plasma beam provides better control over etching.

Figures 3A, 3B:
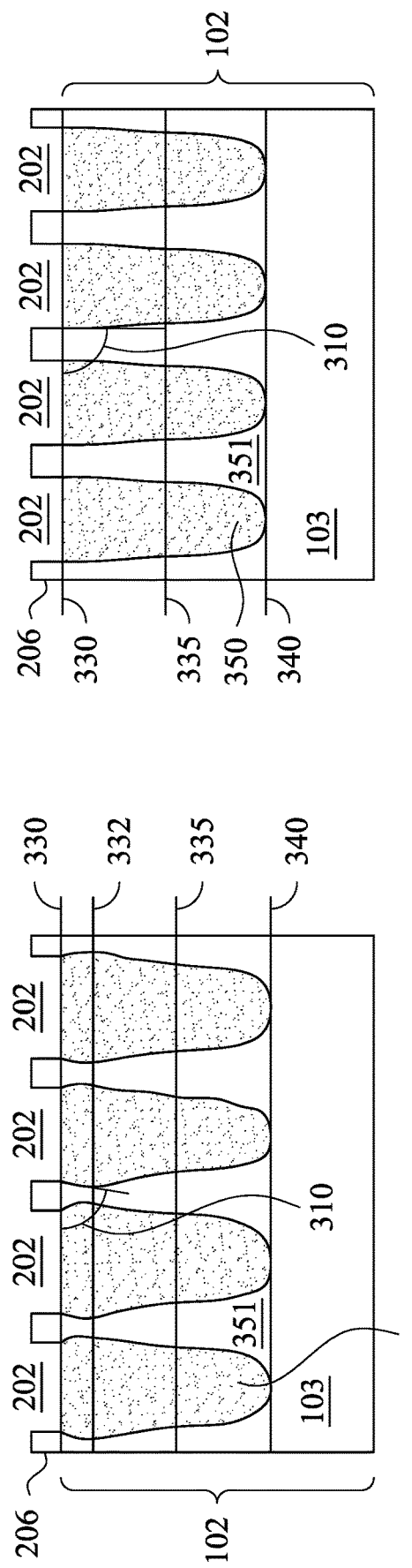
FIGS. 3A and 3B show etching of vias in a substrate in accordance with some embodiments of the present disclosure.

FIGS. 3A and 3B show etching of vias 350 in a substrate. FIG. 3A shows vias 350 that extend in an insulator layer 351 that are formed by a dry etching method in the initial substrate 102 and the vias 350 connect between a top surface 330 and a bottom surface 340 of the insulator layer 351. In some embodiments, and consistent with FIGS. 2A and 2B, the protective layer 206, e.g., an etch stop layer or a hard mask layer, is disposed over the initial substrate 102 and the initial substrate 102 includes the insulator layer 351 that is consistent with the insulator layer 252. The protective layer 206 is patterned and one or more openings 202 is produced in the protective layer 206 and the vias 350 are produced in the insulator layer 351 through the openings 202. In some embodiments, the base substrate 103 includes other circuits with connection lines, e.g., lower connection lines, and the vias 350 connect between the lower connection lines under the insulator layer 351 in the base substrate 103 and the connection lines, e.g., upper connection lines, of the circuits (not shown) that are formed over the insulator layer 351. As shown, the thickness of the vias 350 at different intersecting surfaces 332, 335, and 340 are not the same. In addition, the vias 350 become narrower at the top surface 330, above the intersecting surface 332, and the via 350 produce an angle 310 with the top surface 330 and causes the vias 350 to become closest to each other at the surface 332 such that bridging may occur at the surface 332.

FIG. 3B shows vias 350, consistent with via 204 of FIG. 2D, that extend in the insulator layer 351 that are formed by a low intensity plasma beam consistent with the low intensity plasma beam 225 of FIG. 2D. In some embodiments, the angle 310 between a side of the via 350 and the intersecting surface 330 of FIG. 3A, is 86 degrees and the angle 310 becomes 89 degrees in FIG. 3B when the low intensity plasma beam is used. In some embodiments, the better control over the low intensity plasma beam is used to provide more straight and uniform vias and reduce the probability of bridging.

Figure 3D:
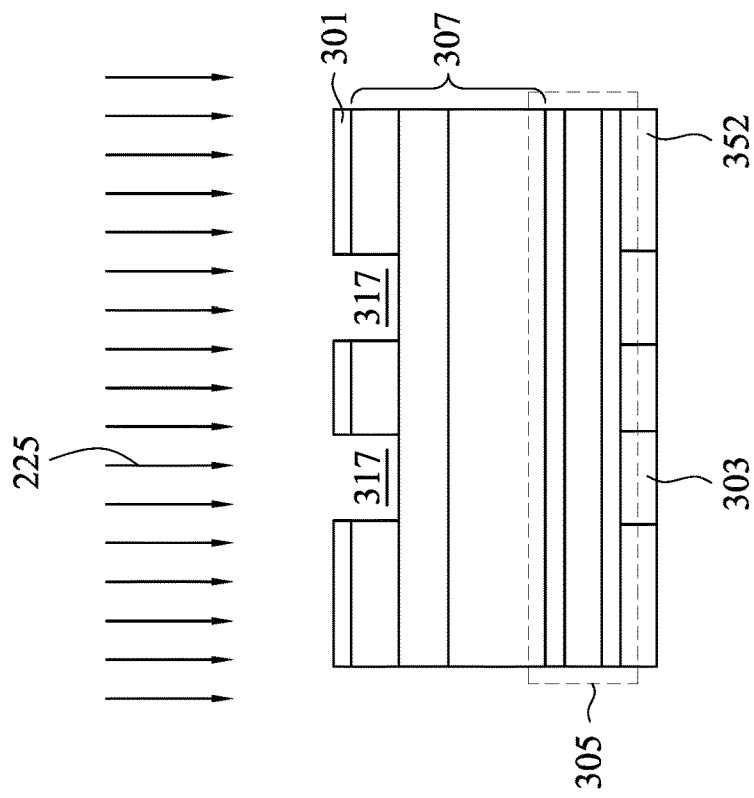
FIGS. 3C, 3D, 3E, 3F, 3G, 3H, 3I, and 3J show a semiconductor device and a via etched in the semiconductor device in accordance with some embodiments of the present disclosure.
Figure 3C:
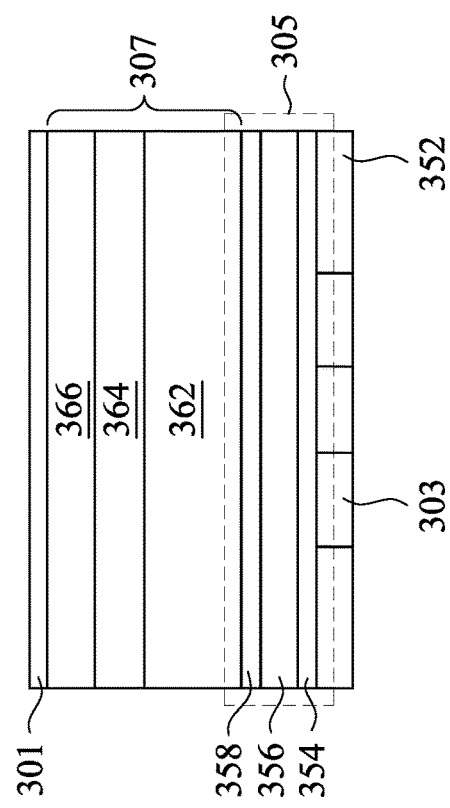

FIGS. 3C, 3D, 3E, 3F, 3G, 3H, 3I, and 3J show a semiconductor device and a via etched in the semiconductor device in accordance with some embodiments of the present disclosure. FIG. 3C shows a semiconductor device having a base layer 352 that is made of low-k oxide layer that has a thickness of about 300 angstroms (Å). In some embodiments, the base layer 352 is deposited by a chemical vapor deposition (CVD) operation on a substrate (not shown) consistent with the base substrate 103 of FIG. 3A. In some embodiments, the base layer 352 includes a metal layer 303 that provides the lower connection lines for the circuits in the substrate. In some embodiments, a layer 305 that is a combination of 3 layers 354, 356, and 358 is disposed on top of the base layer 352. The layer 354 that is deposited by a CVD operation or a physical vapor deposition (PVD) operation on top of the base layer 352 includes a combination of oxide and aluminum or a combination of nitride and aluminum and has a thickness of less than 300 A. The layer 356 that is deposited by CVD operation or PVD operation is made of oxygen doped silicon carbide and has a thickness of less than 300 A. The layer 358 that is deposited by a CVD operation or a PVD operation on top of the layer 356 includes a combination of oxide and aluminum or a combination of nitride and aluminum and has a thickness of less than 300 A.

In some embodiments, a layer 307 that is a combination of 3 layers 362, 364, and 366 is disposed on top of the layer 305. The layer 362 that is deposited by a CVD operation or a PVD operation on top of the layer 358 is made of or includes low-k oxide and has a thickness between about 300 A and about 1000 A. The layer 364 that is deposited by a CVD operation or a PVD operation on top of the layer 362 is made of or includes Tetraethyl orthosilicate (TEOS) and has a thickness between about 300 A and about 1000 A. The layer 366 that is deposited by a CVD operation or a PVD operation on top of the layer 364 is made of or includes titanium nitride (TiN) and has a thickness between about 300 A and about 1000. The layer 301 that is deposited by a CVD operation or a PVD operation on top of the layer 366 is made of or includes TEOS and has a thickness of less than 300 A.

FIG. 3D shows the semiconductor device of FIG. 3C that has the base layer 352 having the metal layer 303, the layer 305 disposed over the base layer 352, the layer 307 disposed over the layer 305, and the layer 301 disposed over the layer 307. The semiconductor device of FIG. 3D is covered by a patterned etch stop layer (not shown) over the layer 301 and the layer 301 and the layer 366 of the layer 307 are etched by the low intensity plasma beam 225 of FIG. 2D and the vias 317 are produced in the semiconductor device of FIG. 3D. In some embodiments, the low intensity plasma beam 225 partially etches the layer 364.

Figure 3F:
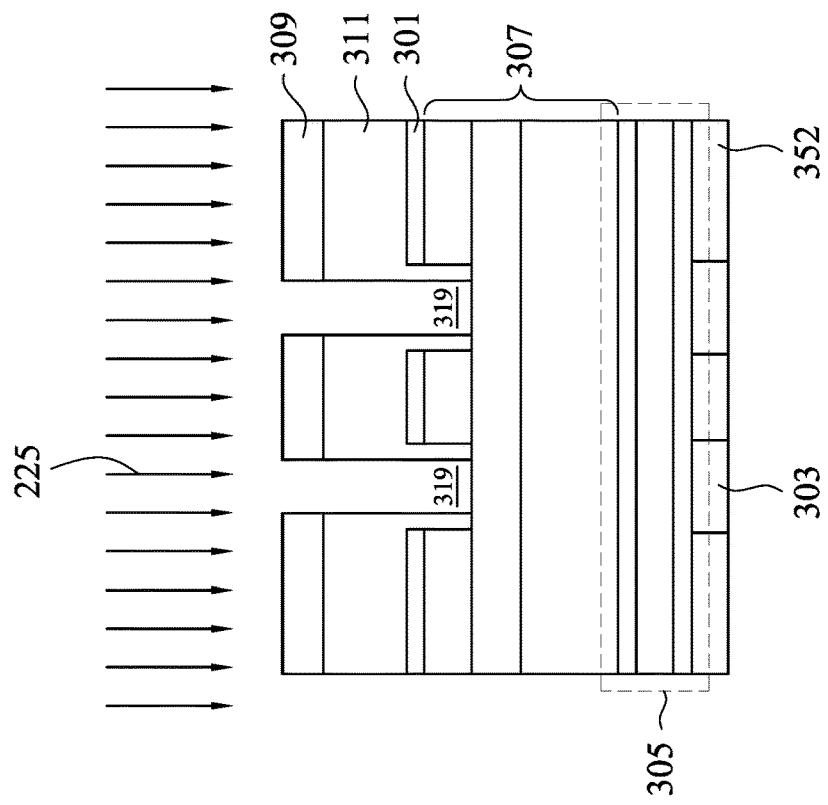
Figure 3E:
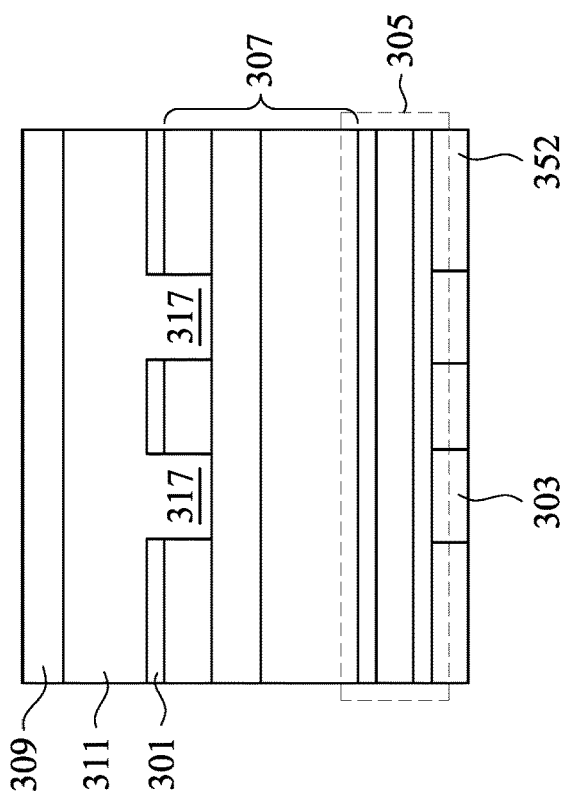

FIG. 3E shows the semiconductor device of FIG. 3D with a photo resist layer 311 disposed in the vias 317, over the layer 364, and over the layer 301. Also, a layer 309 is disposed over the photo resist layer 311. In some embodiments, the layer 309 is an oxide layer disposed by a CVD operation or a PVD operation at a low temperature.

FIG. 3F shows the semiconductor device of FIG. 3E that is covered by a patterned etch stop layer (not shown) over the layer 309 and the layers 309 and 311 are etched by the low intensity plasma beam 225 of FIG. 2D and the vias 319 are produced in the layers 311 and 309 of the semiconductor device of FIG. 3E. In some embodiments, the vias 319 are etched to the top of the layer 364.

Figure 3H:
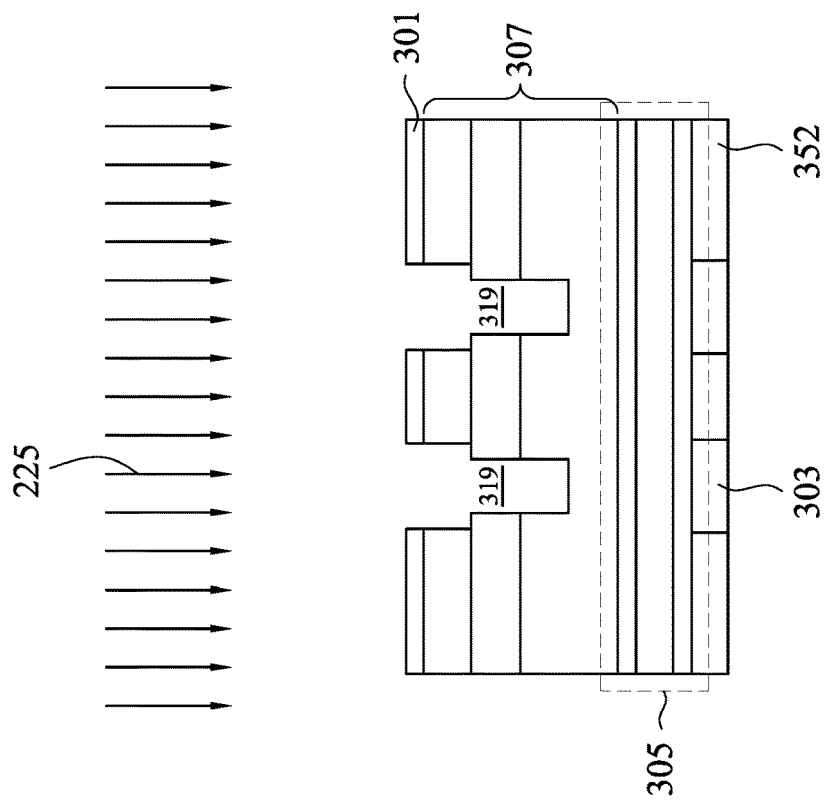
Figure 3G:
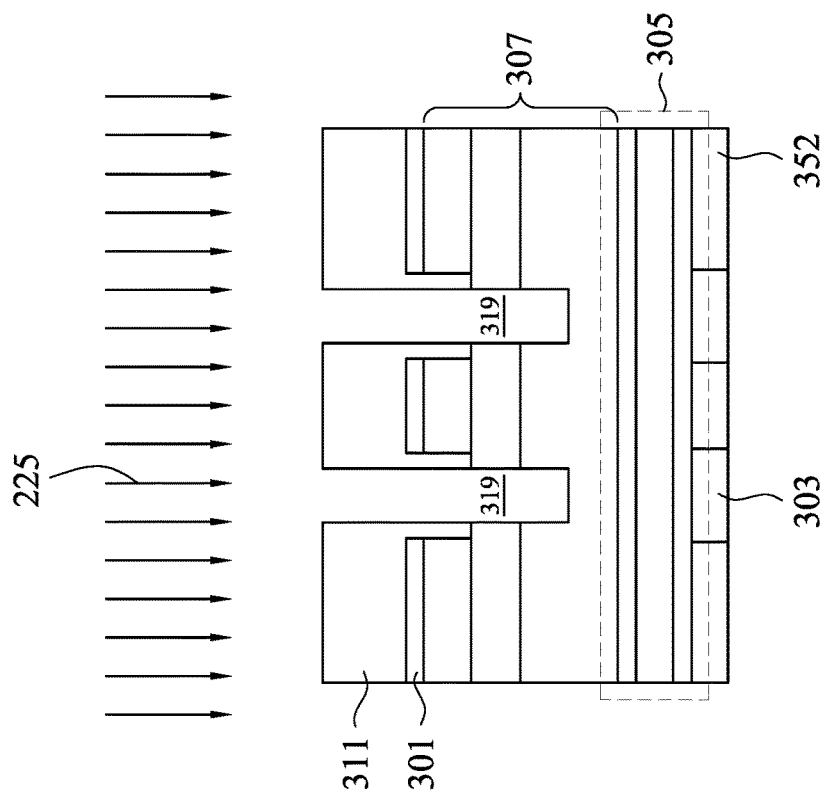

FIG. 3G shows the semiconductor device of FIG. 3F such that the patterned etch stop layer (not shown) over the layer 309 is removed and the low intensity plasma beam 225 further continues etching such that the layer 309 on top of the layer 307 is also completely etched and the vias 319 further deepens and part of the layer 307 is etched such that the layers 364 and 366 and part of the layer 362 in the vias 319 are etched. In some embodiments, the vias 319 of FIG. 3G are partial vias.

FIG. 3H shows the semiconductor device of FIG. 3G with the low intensity plasma beam 225 further continues etching such that the layer 311 on top of the layer 307 is completely etched and the vias 319 further deepens and part of the layer 307, e.g., the layer 362 in the vias 319, is further etched.

Figure 3J:
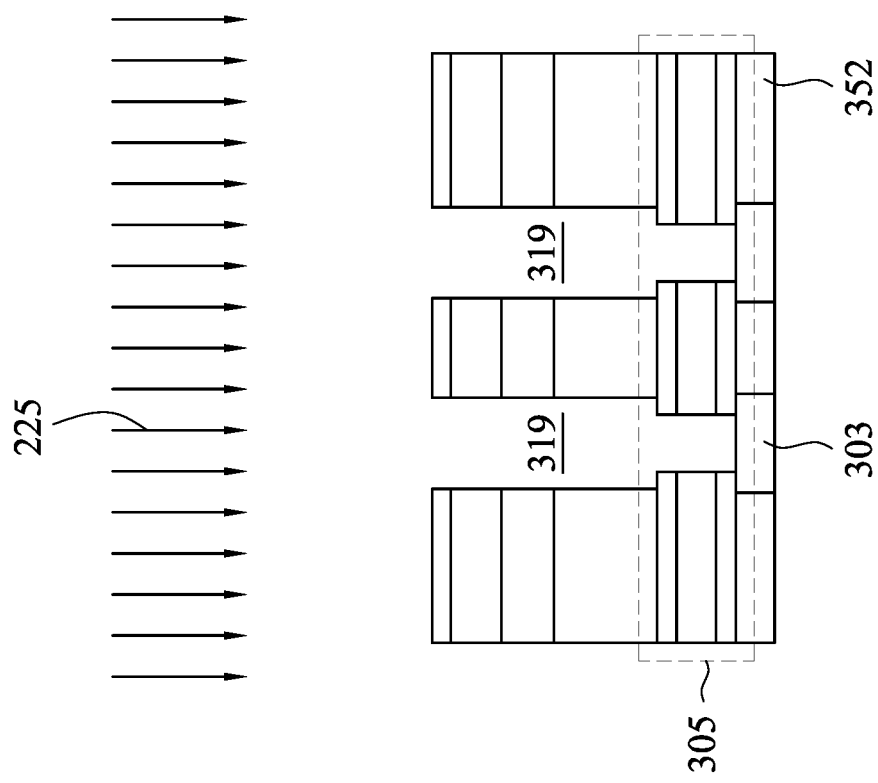
Figure 3I:
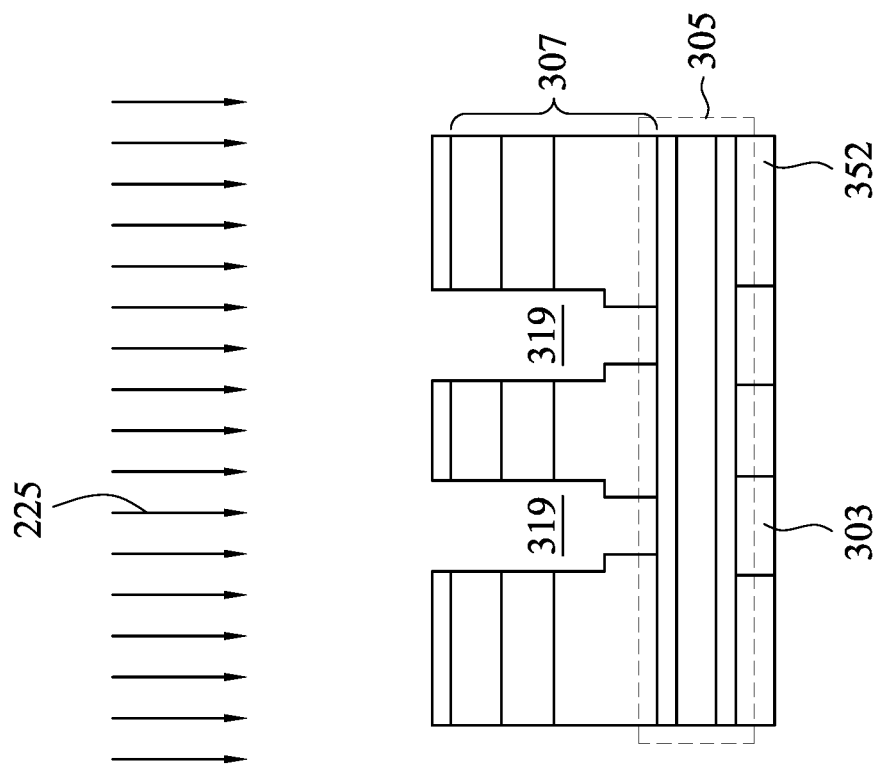

FIG. 3I shows the semiconductor device of FIG. 3H with the low intensity plasma beam 225 further continues etching such that the vias 319 further deepens and the layer 307 is completely etched such the vias 319 reaches the top of the layer 305. In addition, the layer 301 over the layer 307 outside the vias 319 are etched.

FIG. 3J shows the semiconductor device of FIG. 3I with the low intensity plasma beam 225 that further continues etching such that the vias 319 further deepens and the layer 305 is completely etched such the vias 319 reaches the top of the metal layer 303. In some embodiments, the vias 319 of FIG. 3J are similar to the vias 350 of FIG. 3B and are metal vias that are later filled with a metal, e.g., copper, and connect the lower connection lines to the upper connection lines.

Figure 3N:
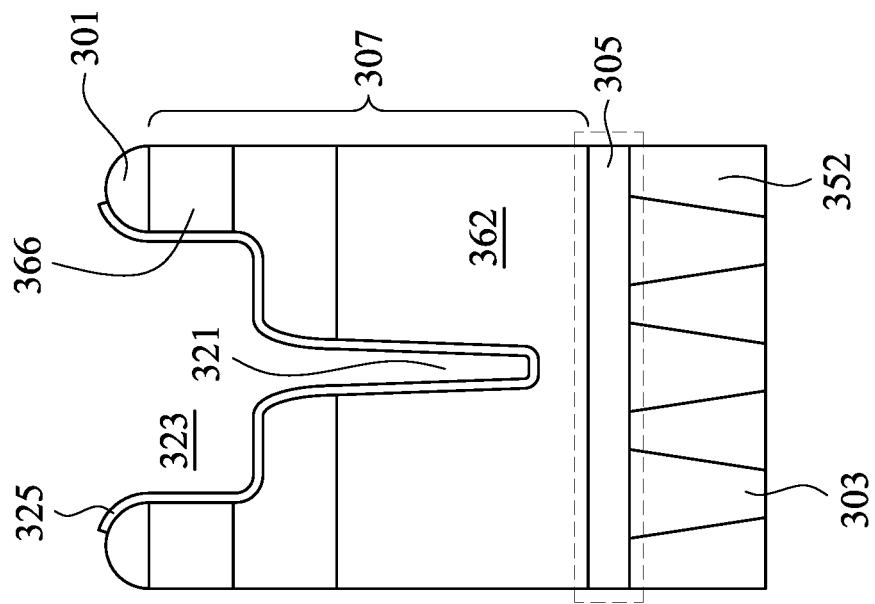
FIGS. 3M, 3N, 3P, 3Q, 3R, and 3S show a semiconductor device and etching a metal via with atomic layer etching in the semiconductor device in accordance with some embodiments of the present disclosure.
Figure 3M:
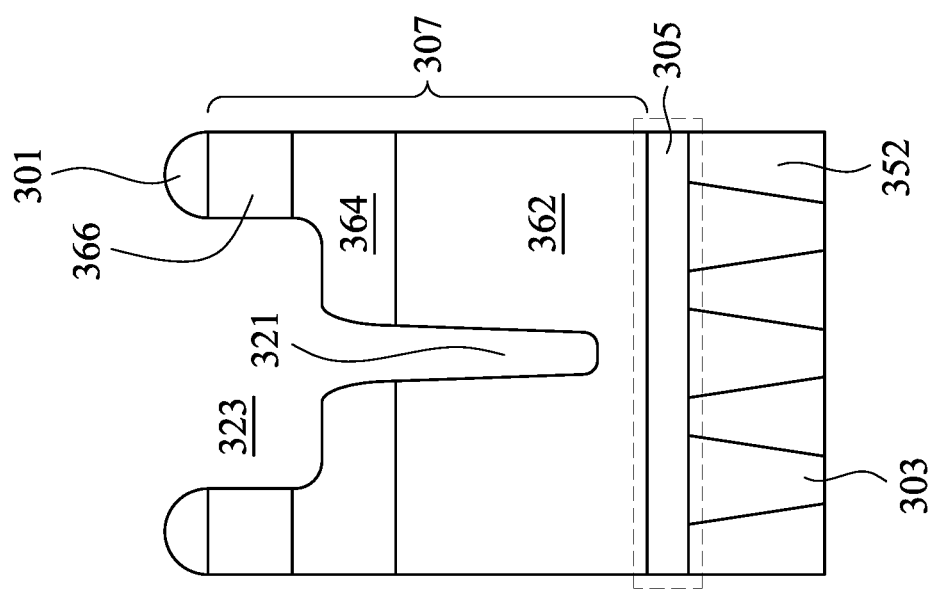

FIGS. 3M, 3N, 3P, 3Q, 3R, and 3S show a semiconductor device and etching a metal via with atomic layer etching in the semiconductor device in accordance with some embodiments of the present disclosure. FIG. 3M is consistent with FIG. 3H and shows the semiconductor device with the base layer 352 having the metal layer 303 and also includes the layers 305, 307, and 301. FIG. 3M also shows a via 323 extending in the layer 301 and an upper part of the layer 307 and another via 321 that extends into a lower part of the layer 307. In some embodiments, the layer 301 is covered by a first patterned etch stop layer (not shown) and via 323 is produced by etching the layer 301 and the upper part of the layer 307 with the low intensity plasma beam 225. In some embodiments, the bottom of the via 323 is covered by a second patterned etch stop layer (not shown) and via 321 is produced by etching the lower part of the layer 307 with the low intensity plasma beam 225. In some embodiments, atomic layer etching is used for producing the vias 321 and 323.

FIG. 3N is consistent with FIG. 3M and shows the semiconductor device of FIG. 3M. A film 325 of polymer, e.g., a $C_xF_y$, is conformally deposited around the surface area of the vias 321 and 323. The film 325 interacts with a layer beneath the film 325 of the surface area of the vias 321 and 323.

Figure 3Q:
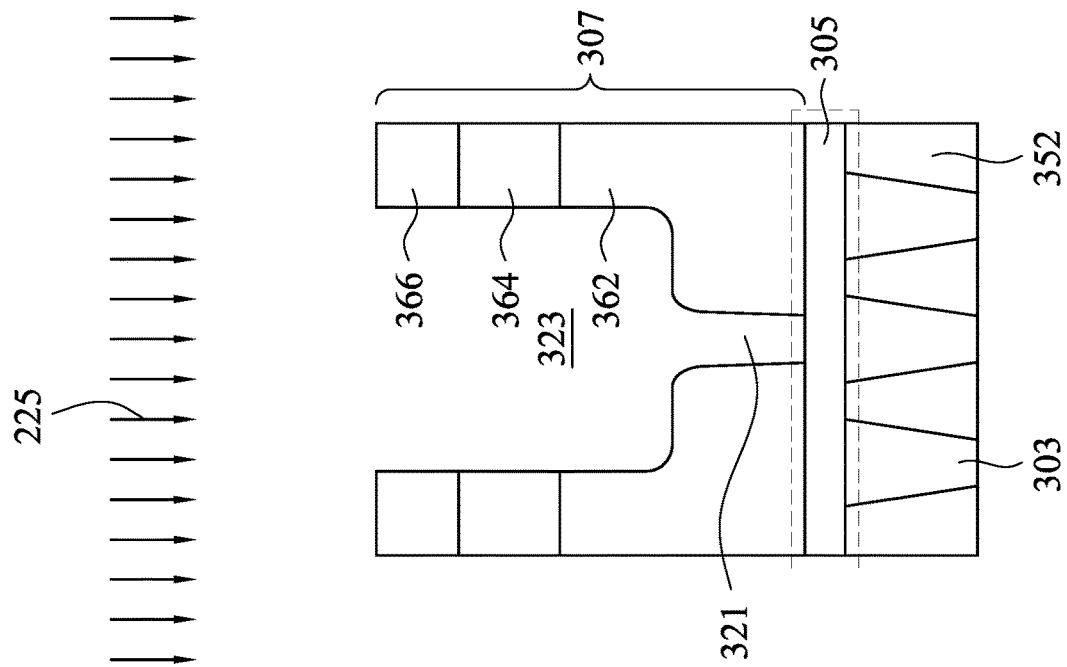
Figure 3P:
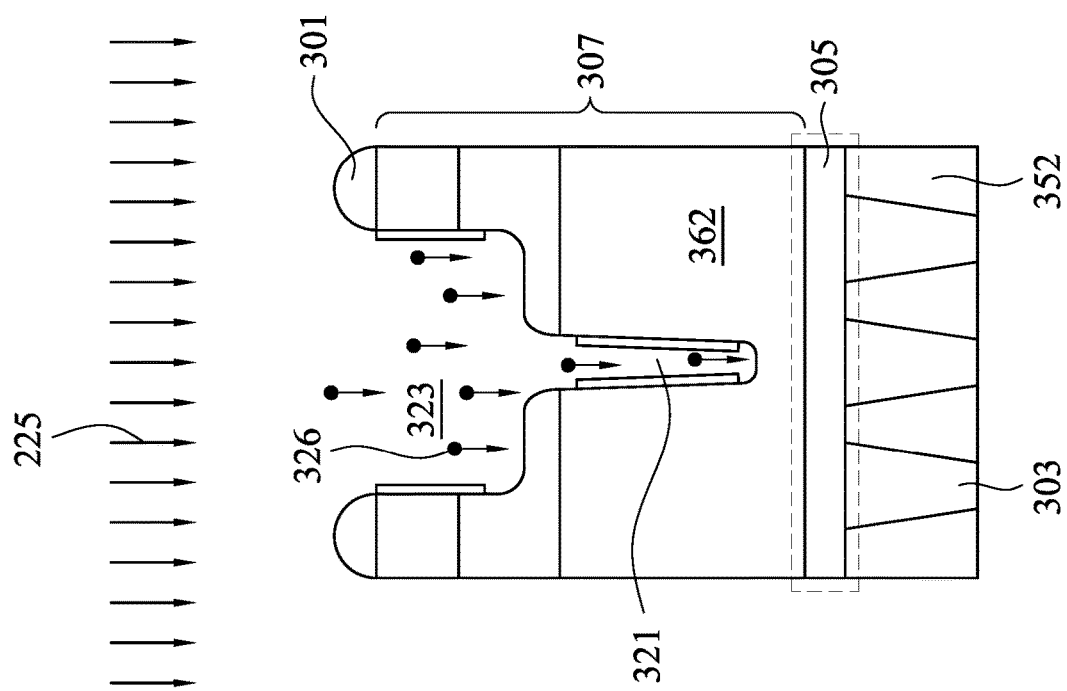

FIG. 3P is consistent with FIG. 3N and shows the semiconductor device of FIG. 3N. The interacted film 325 with one layer beneath the surface area of the vias 321 and 323 is removed by the low intensity plasma beam 225. As will be described with respect to FIGS. 4A and 4B, the ions 326 of the low intensity plasma beam 225 may impinge vertically or with a tilt angle on the surface area of the vias 321 and 323 that is covered with the polymer and a single layer of the surface area of the vias 321 and 323 is removed in an atomic layer etching method.

FIG. 3Q is consistent with FIG. 3P and shows the semiconductor device of FIG. 3P. The procedure of conformally depositing film 325 and removing the film and a single layer beneath the film 325 is repeated in the atomic layer etching method and the vias 321 and 323 extend deeper such that the bottom of the via 321 reached the top of the layer 305.

Figure 3S:
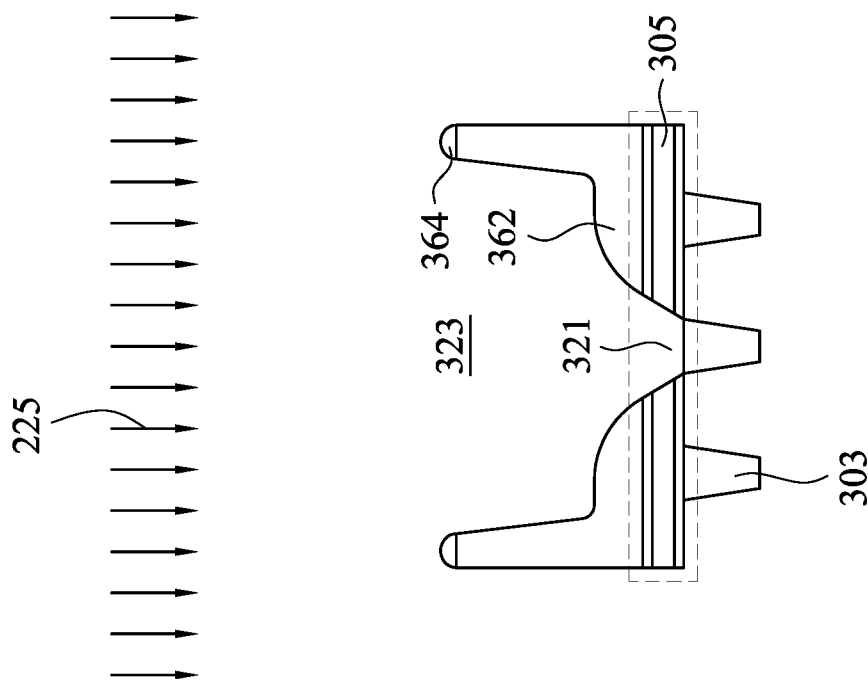
Figure 3R:
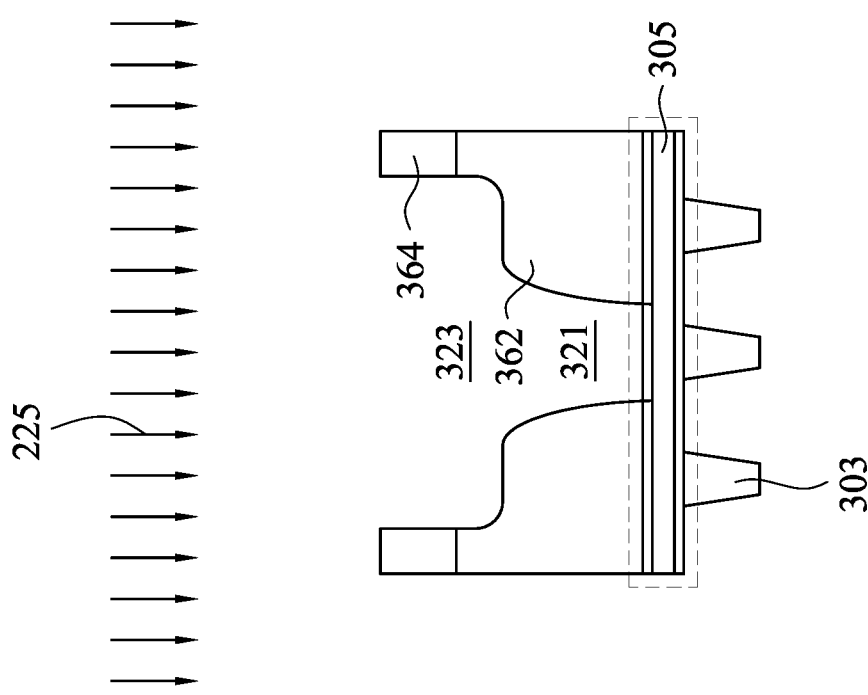

FIG. 3R is consistent with FIG. 3Q and shows the semiconductor device of FIG. 3Q. In FIG. 3R, the atomic layer etching method of the vias 321 and 323 continues until the layer 366 outside the vias is completely removed and the layer 305 inside the via 321 is partially etched.

Figure 4A:
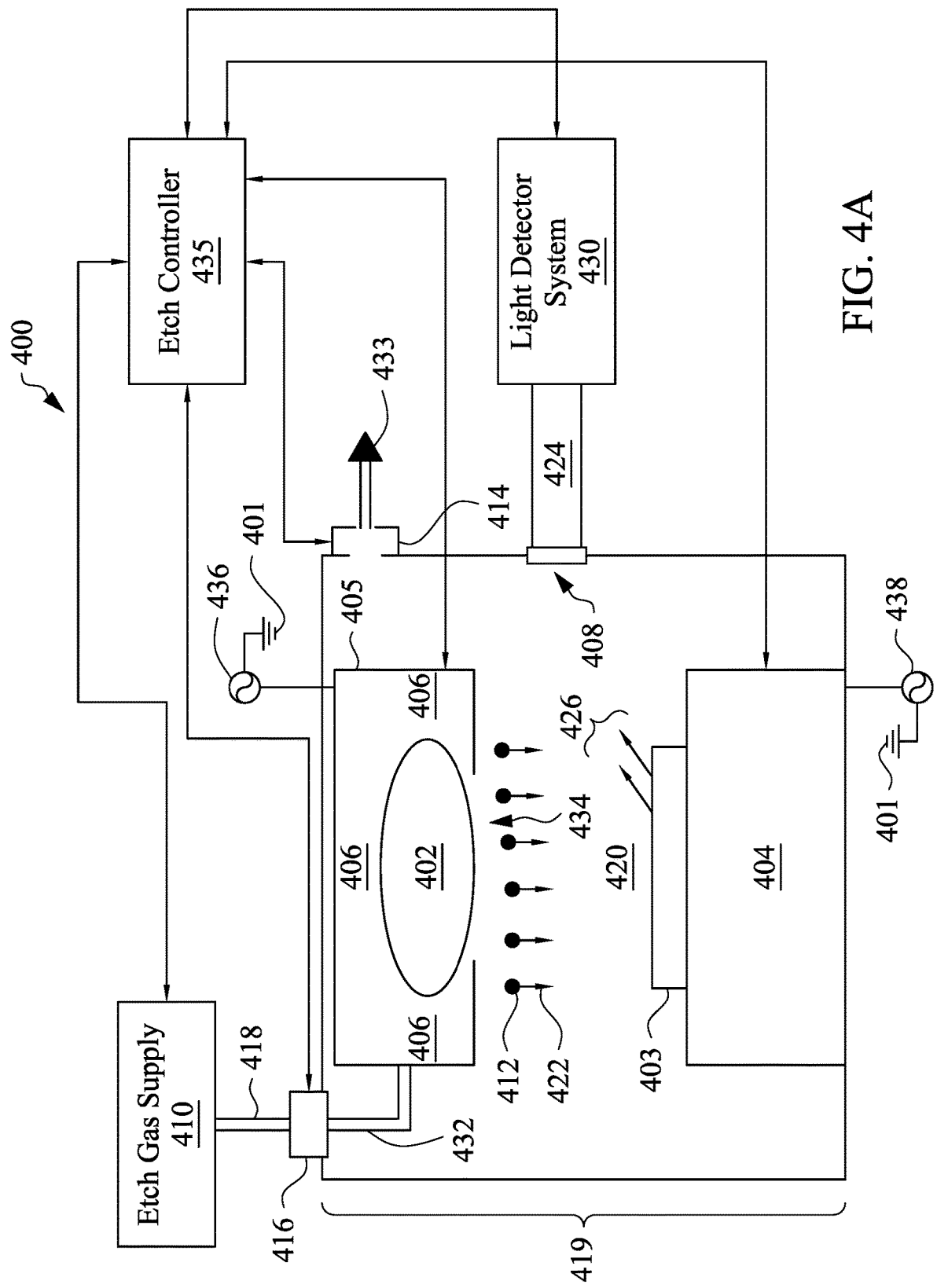
FIGS. 4A and 4B show schematic diagrams of plasma etching systems in accordance with some embodiments of the present disclosure.
Figure 4B:
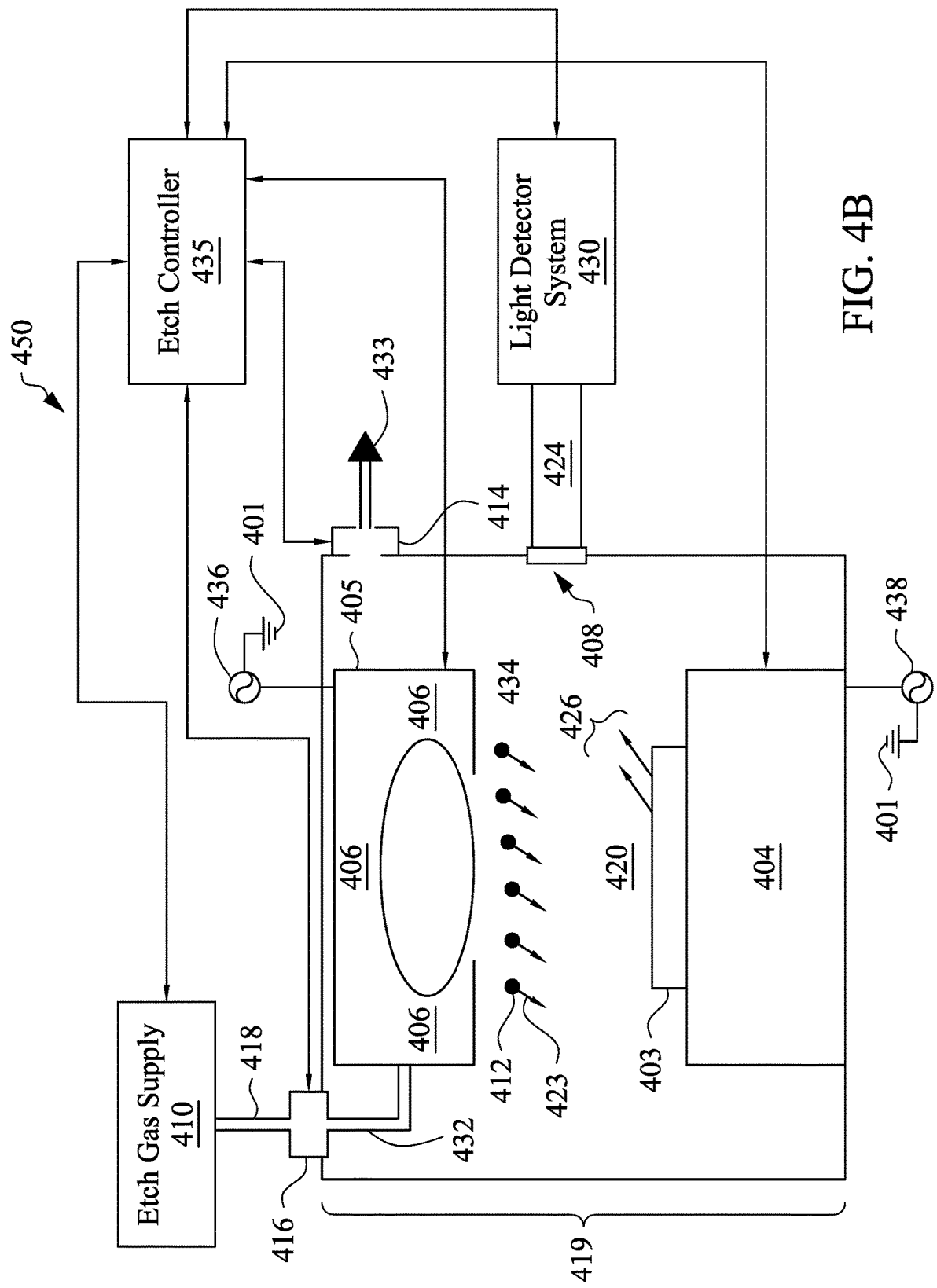

FIG. 3S is consistent with FIG. 3R and shows the semiconductor device of FIG. 3R. In FIG. 3S, the atomic layer etching method of the vias 321 and 323 continues until the layer 364 outside the vias is partially removed and the layer 305 inside the via 321 is completely etched and the via 321 comes into contact with the metal layer 303. FIGS. 4A and 4B show schematic diagrams of plasma etching systems 400 and 450 in accordance with some embodiments of the present disclosure. The plasma etching system includes plasma etcher 419 having a dry etching chamber 420 therein. The plasma etcher 419 includes a plasma beam generator 405 that includes a plasma cavity 402 and an electric-control circuit 406 around the plasma chamber. The plasma beam generator 405 is connected via a voltage source 436 to a ground 401. The plasma beam generator 405 is connected via a pipe 432 to a flow rate controller 416, e.g., an adjustable valve, of the plasma etcher 419. The flow rate controller 416 is connected via a pipe 418 to an etch gas supply 410 of the plasma etching systems 400 or 450. The etch gas supply 410 contains an etching gas that includes one or a combination of the gasses $O_2$, $C_xF_y$, e.g., $C_3F_8$, $C_xH_yF_z$, e.g., $CH_3F_8$, Ar, $N_2$, $H_2$, CO, $CO_2$, $B_xCl_y$, $Cl_2$, $N_xF_y$, HBr, or $CH_4$. The etch gas supply 410, the flow rate controller 416, and the plasma beam generator 405 are connected to an etch controller 435 of the plasma etching systems 400 or 450 and are controlled by the etch controller 435. The etch controller 435 commands the etch gas supply 410 to release etching gas of the etch gas supply 410 through the pipe 418 to the flow rate controller 416. The etch controller 435 commands the flow rate controller 416 to allow a predefined flow rate of the etching gas, determined by the etch controller 435, to go through the pipe 432 to the plasma beam generator 405. The etch controller 435 commands the electric-control circuit 406 of the plasma beam generator 405 to apply a high voltage in the plasma cavity 402 and generate a plasma beam 412 from the etching gas in the electric-control circuit 406. The plasma leaves the plasma beam generator 405 from an opening 434 of the plasma beam generator 405.

The plasma etcher 419 also includes a stage 404 and the stage 404 holds a substrate 403. The stage 404 is connected via a voltage source 438 to the ground 401. In addition, the stage 404 is also connected to the etch controller 435. In some embodiments, as shown in FIG. 4A, the etch controller 435 commands the stage 404 and electric-control circuit 406 of the plasma beam generator 405 to make the plasma beam 412 to leave the plasma beam generator 405 in a direction 422 having a perpendicular angle with the surface of the substrate 403. In some embodiments, as shown in FIG. 4B, the etch controller 435 commands the stage 404 and electric-control circuit 406 of the plasma beam generator 405 to make the plasma beam 412 to leave the plasma beam generator 405 in a direction 423 having a tilted angle with the surface of the substrate 403. In some embodiments, the electric-control circuit 406 of the plasma chamber applies a tilted electric field or applies a magnetic field to the plasma beam 412 to induce the direction 423 for the plasma beam 412.

The plasma etcher 419 also includes an adjustable valve 414 that is connected to the etch controller 435 and is controlled by the etch controller 435. An exit gas 433 of the plasma etcher 419 leaves the plasma etcher 419 via the adjustable valve 414. As shown in FIGS. 4A and 4B, the plasma beam 412 is discharged after impinging on the substrate and produces emitted light 426. In some embodiments, the exit gas 433 is the etching gas that is discharged. In some embodiments, the exit gas 433 is pump purged out of the dry etching chamber 420 by a pump (not shown) that is coupled to the adjustable valve 414 for drawing the exit gas 433. In some embodiments, the emitted light 426 is at a characteristic wavelength of the etching gas and/or the etched target layer (byproducts). In some embodiments, a portion of the emitted light 426 is received by an entrance pupil function 408 of a light detector system 430. The light detector system 430 is connected to the etch controller 435 and is controlled by the etch controller 435. In some embodiments, when the etch controller 435 commands the plasma beam generator 405 to generate the plasma beam 412, the etch controller 435 also commands the light detector system 430 to measure the emitted light 426. In some embodiments, the received emitted light 426 is transferred through a conduit 424, e.g., an optical fiber, to the light detector system 430. The light detector system 430 is described in more details with respect to FIGS. 5A-5C.

FIGS. 5A 5B, and 5C show a diffraction grating system for differentiating multiple wavelengths of an incident light beam, a light detector array, and a grating structure in accordance with some embodiments of the present disclosure. As shown in FIG. 5A, the diffraction grating system includes the conduit 424 and the light detector system 430. The light detector system 430 includes a diffraction grating 510 and an array detector 520 of light detectors 502. The conduit 424 provides at least a portion of the emitted light 426 to the diffraction grating 510 of the light detector system 430. The diffraction grating 510 is shown in FIG. 5C having alternatively arranged dark strips 524 (with a value of zero) and bright strips 522 (with a value of 1). The bright strips 522 are essentially transparent to the emitted light 426 as shown by an amplitude of one on the vertical coordinate and dark strips 524 are essentially opaque to the emitted light 426 as shown by an amplitude of zero on the vertical coordinate. As shown in FIG. 5C, a pitch 526 of the diffraction grating 510 is essentially twice a width 525 of the bright strips 522. FIG. 5B shows another array detector 520 of closely packed light detectors 509. In some embodiments, the array detector 520 of light detectors 509 provide a better wavelength resolution compared with the array detector 520 of light detectors 502. In some embodiments, the pitch 526 of the diffraction grating 510 is between about 200 nm to about 800 nm.

In some embodiments, when a received light through the conduit 424 impinges on the diffraction grating 510, the received light is diffracted at both positive and negative first order diffraction angles. In some embodiments, a light beam 508 is a negative first order diffraction and a light beam 506 is a positive first order diffraction. An angle of the first order diffractions with a direction 503 depends on the wavelength of the received light and the positive and negative first order diffractions, for a specific wavelength, are symmetrically diffracted with respect to the direction 503. Thus, each first order diffraction of the received light having a specific wavelength is detected by a first light detector 502 of the array detector 520 above the direction 503 and by second light detector 502 of the array detector 520 symmetrically arranged with respect to direction 503. In some embodiments, the readings of the first and second light detector 502 are added together to generate the light intensity of the first order diffraction associated with the wavelength of the received light. Therefore, the intensity of the emitted light 426 associated with the characteristic wavelength of the etching gas may be measured by the light detector system 430.

In some embodiments, the flow rate controller 416 is set to a low flow rate of less than 10 standard cubic centimeters per minute (sccm) for the etching gas to produce a low intensity plasma beam. When the flow rate of the etching gas that enters the plasma etcher is below 10 sccm, the relation between the plasma beam intensity and the flow rate of the etching gas set by the flow rate controller 416 may not be linear (e.g., is not accurate) and the flow controller of the plasma etcher needs recalibration for low flow rates.

As noted above, in some embodiments, the flow rate controller 416 of the plasma beam generator 405 is recalibrated for the low flow rates based on the detected emitted light 426 associated with a series of low flow rates of the flow rate controller 416. In some embodiments, the flow rate controller 416 of the plasma beam generator 405 is consecutively set to the series of low flow rates, e.g., flow rates below 5 or 10 sccm. For each flow rate, the intensity of the received emitted light 426 associated with the characteristic wavelength of the etching gas is measured. A graph is created with the series of low flow rates of the flow rate controller 416 on one coordinate and the measured intensity of the received emitted light 426 on another coordinate. A linear curve is fitted to the graph and the flow rate controller 416 is recalibrated based on the fitted linear curve. In some embodiments, the flow rate controller 416 is recalibrated based on a piecewise linear curve between the points on the graph. In some embodiments, after the recalibration, a controlled precision of less than one percent is achieved in 3 nm process for 3 nm semiconductor node.

Figure 6A:
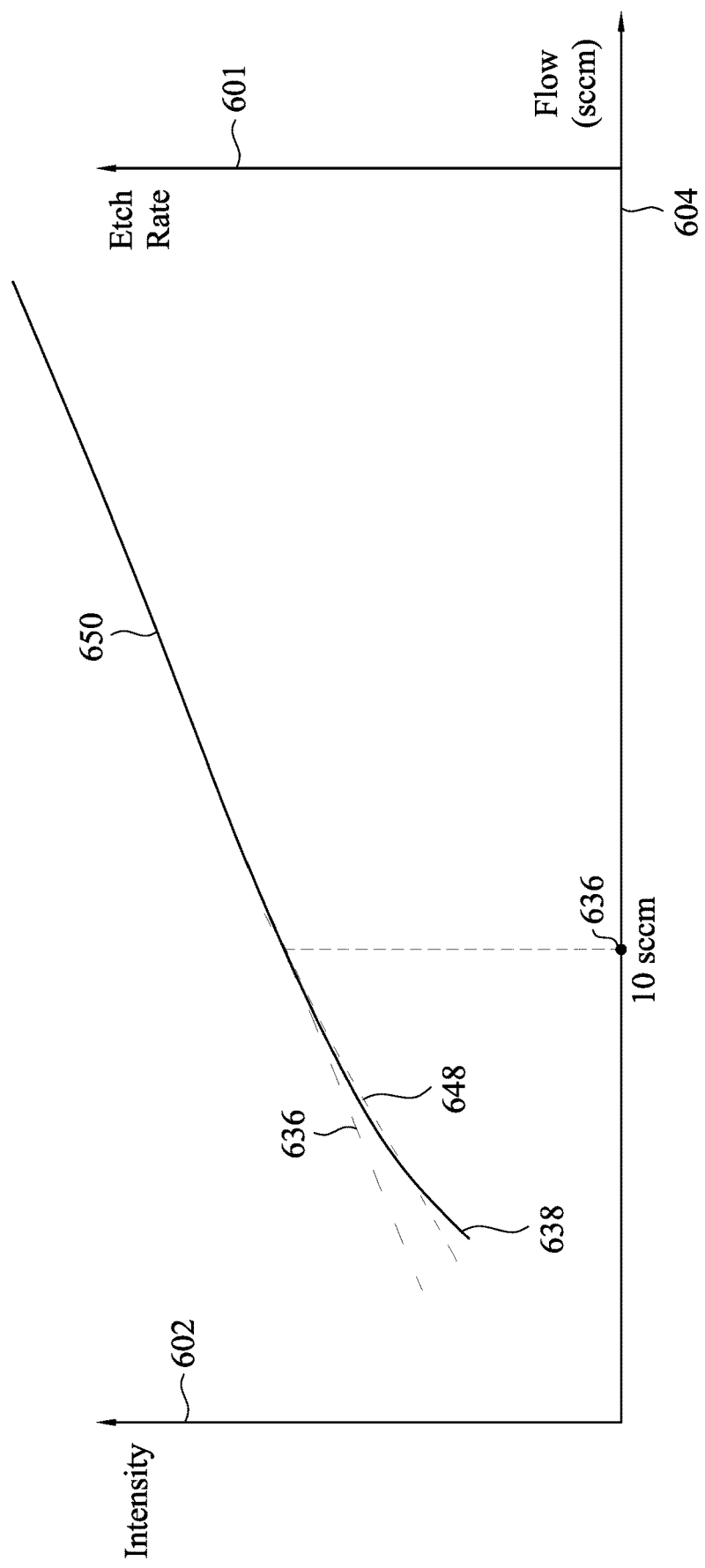
FIGS. 6A, 6B, 6C and 6D show graphs of measured intensity of plasma gas versus the flow rate of etching gas of a plasma etching system in accordance with some embodiments of the present disclosure.

FIGS. 6A, 6B, 6C, and 6D show graphs of measured intensity of plasma gas versus the flow rate of etching gas of a plasma etching system in accordance with some embodiments of the present disclosure. In FIGS. 6A, 6B, 6C, and 6D the horizontal coordinate 604 is the set flow rate of the etching gas of the plasma beam generator 405 in sccm set by the flow rate controller 416 and the vertical coordinate 602 is the intensity of the received emitted light 426 as detected by a light detector of the array detector 520. As shown in FIG. 6A, a section 650 of a graph of the intensity on the vertical coordinate 602 versus the flow rate (in sccm) on the horizontal coordinate 604 is linear for flow rates above 10 sccm, however, a section 638 of the graph is not linear for the flow rates below 10 sccm and the graph section 638 diverges from a section 636 extending from the section 650. In some embodiments, the non-linear section 638 is approximated with a linear section 648 and the flow rate controller 416 is recalibrated for flow rates below 10 sccm using the linear section 648 below 10 sccm. In some embodiments, the turning point is smaller or greater than 10 sccm, for example, 5 sccm or 15 sccm or therebetween. In some embodiments, the graph of FIG. 6A is displayed based on the flow rate on the horizontal coordinate 604 and a measured etch rate on vertical coordinate 601. In some embodiments, the flow rate controller 416 is recalibrated for flow rates below 10 sccm using the measured etch rates.

In some embodiments, the measured signal of the light detector of the array detector 520 corresponding to the characteristic wavelength of the etching gas is converted to an actual flow rate of the etching gas that after impinging on the substrate 403 of FIG. 4A the plasma discharge occurred for them. The actual flow rate of the etching gas may be calculated using the measured signal of the light detector based on the probability density function of the propagation of the emitted light generated by plasma discharge and a coverage ratio of the entrance pupil function 408 of a light detector system 430. The calculated actual flow rate are used for recalibrating the flow rate controller 416 in some embodiments. In some embodiments, the measured intensities of the OES signal is used for recalibrating the flow rate controller 416.

Figure 6B:
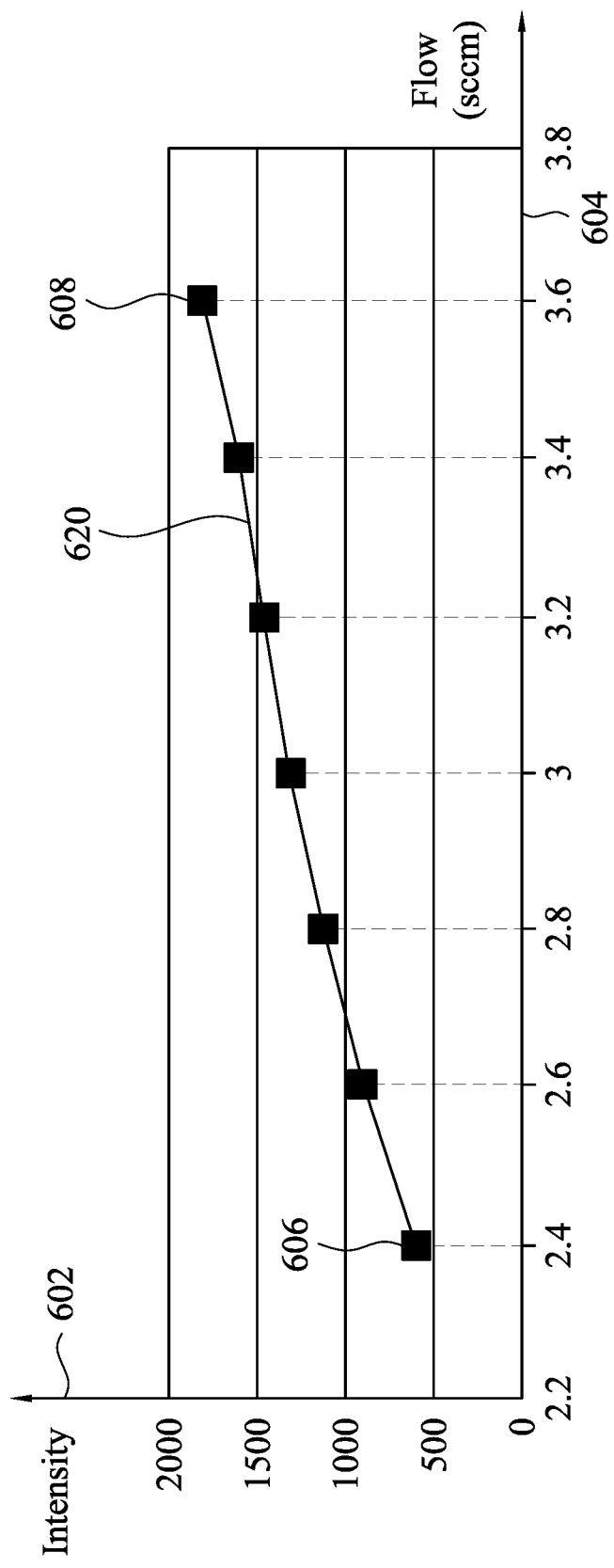
Figure 6C:
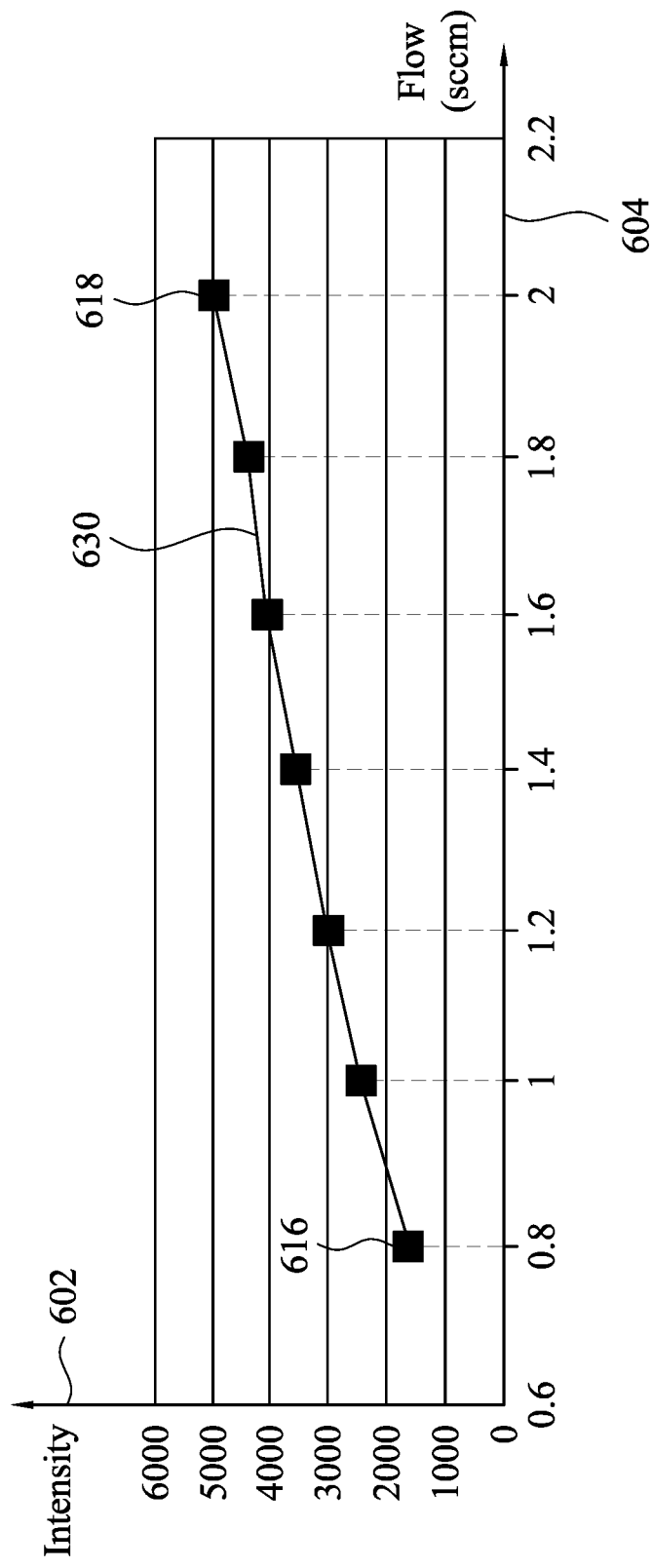
Figure 6D:
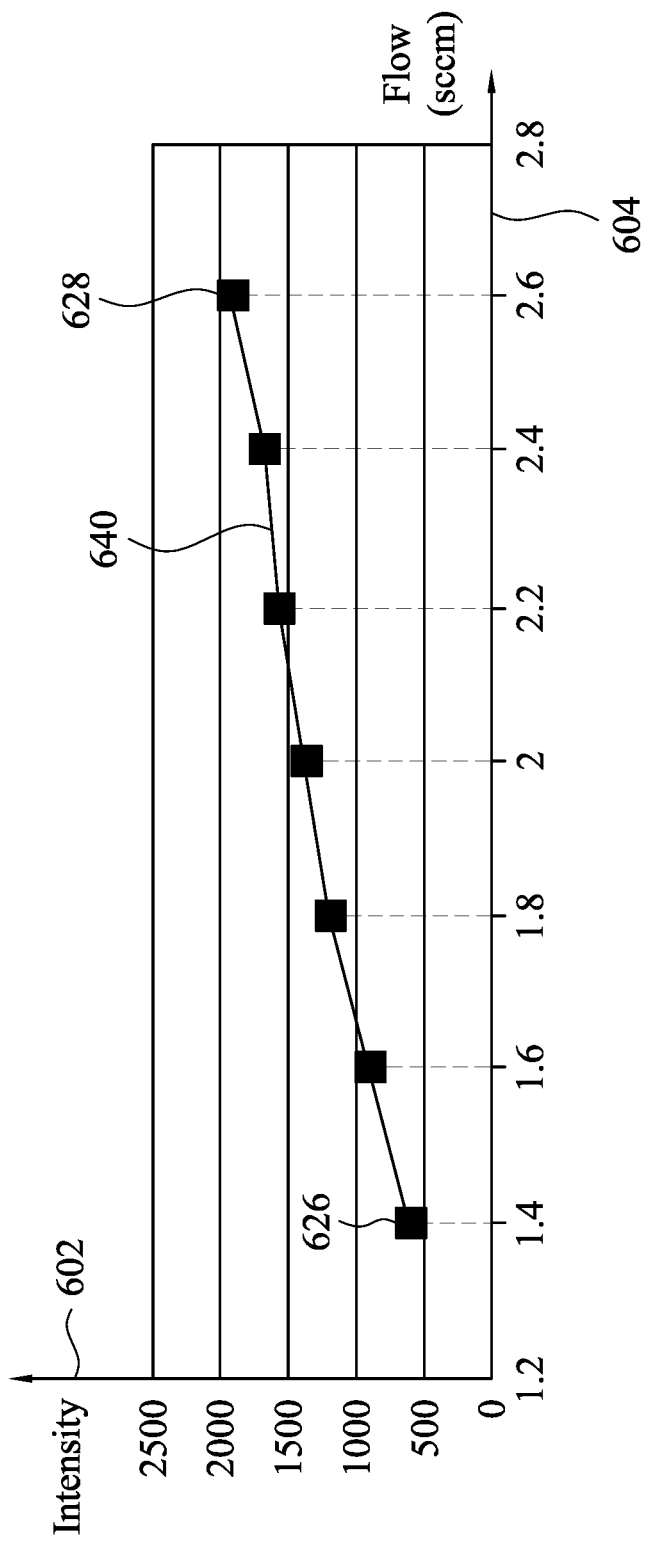

FIGS. 6B, 6C, and 6D are the detected intensity versus the set flow rate, in sccm, of the etching gas of the plasma beam generator 405. In FIG. 6B the etching gas is $C_4F_8$, the characteristic wavelength of the etching gas is 760 nm, and a piecewise linear curve 620 is extended from the initial point 606 to the last point 608. In FIG. 6C the etching gas is $O_2$, the characteristic wavelength of the etching gas is 777 nm, and a piecewise linear curve 630 is extended from the initial point 616 to the last point 618. In FIG. 6D the etching gas is $CH_3F$, the characteristic wavelength of the etching gas is again 760 nm, and a piecewise linear curve 640 is extended from the initial point 626 to the last point 628. In the detected intensity measurements of FIGS. 6B, 6C, and 6D, the intensity on the vertical coordinate 602 is a calculate target element or compound signal versus a background signal related to the characteristic wavelength 347 nm of nickel (Ni). In some embodiments, the graphs of FIGS. 6B, 6C, and 6D are fitted to a linear curve and the fitted linear curve is used for recalibrating an entire range of the flow rate controller.

Figure 7:
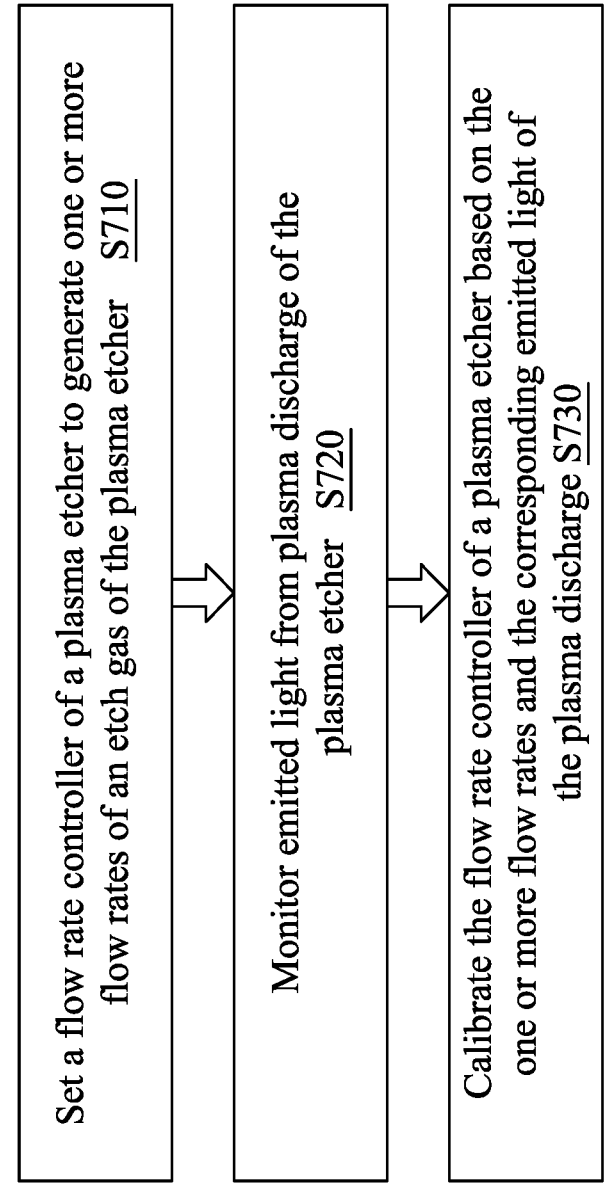
FIG. 7 illustrates a flow diagram of an exemplary process for calibrating a flow rate of a plasma etching system in accordance with some embodiments of the disclosure.

FIG. 7 illustrates a flow diagram of an exemplary process 700 for calibrating a flow rate controller 416 of a plasma etching system 400 in accordance with some embodiments of the disclosure. The process 700 or a portion of the process 700 may be performed by the system of FIG. 4A, or 4B. In some embodiments, the process 700 or a portion of the process 700 is performed and/or is controlled by the computer system 900 described below with respect to FIGS. 9A and 9B. In some embodiments, the process 700 or a portion of the process 700 is performed by the control system 800 of FIG. 8 described below. The method includes an operation S710, where a flow rate controller of a plasma etcher is set to generate one or more flow rates of an etch gas of the plasma etcher. As shown in FIG. 4A, the flow rate controller 416 associated with the plasma beam generator 405 is set to generate one or more flow rates of an etch gas of the plasma etcher as shown in FIGS. 6B, 6C, and 6D.

In operation S720, an emitted light from plasma discharge of the plasma etcher is monitored. In some embodiments, as shown in FIG. 4A, the emitted light 426 from the plasma discharge of the plasma beam 412 on the surface of the substrate 403, is captured through the entrance pupil function 408 and is detected by the light detector system 430. A detected light of the light detector system 430 is transferred to the etch controller 435 to be monitored by the etch controller 435.

In operation S730, the flow rate controller 416 of a plasma etcher 419 is calibrated based on the one or more flow rates and the corresponding emitted light 426 of the plasma discharge. In some embodiments, a graph is created with two or more flow rates on one coordinate and two or more detected intensity of the emitted light 426 on another coordinate. A linear curve is fitted to the graph and the flow rate controller 416 is recalibrated based on the fitted linear curve. In some embodiments, if the one or more flow rates and the corresponding one or more detected intensity of the emitted light 426 are only one first flow rate and one detected intensity of the emitted light 426, the flow rate controller 416 is recalibrated based on a ratio between the one first flow rate and one detected intensity of the emitted light 426. After the calibration, an etching operation using the calibrated flow rate is performed to etch the target layer as set forth above.

Figure 8:
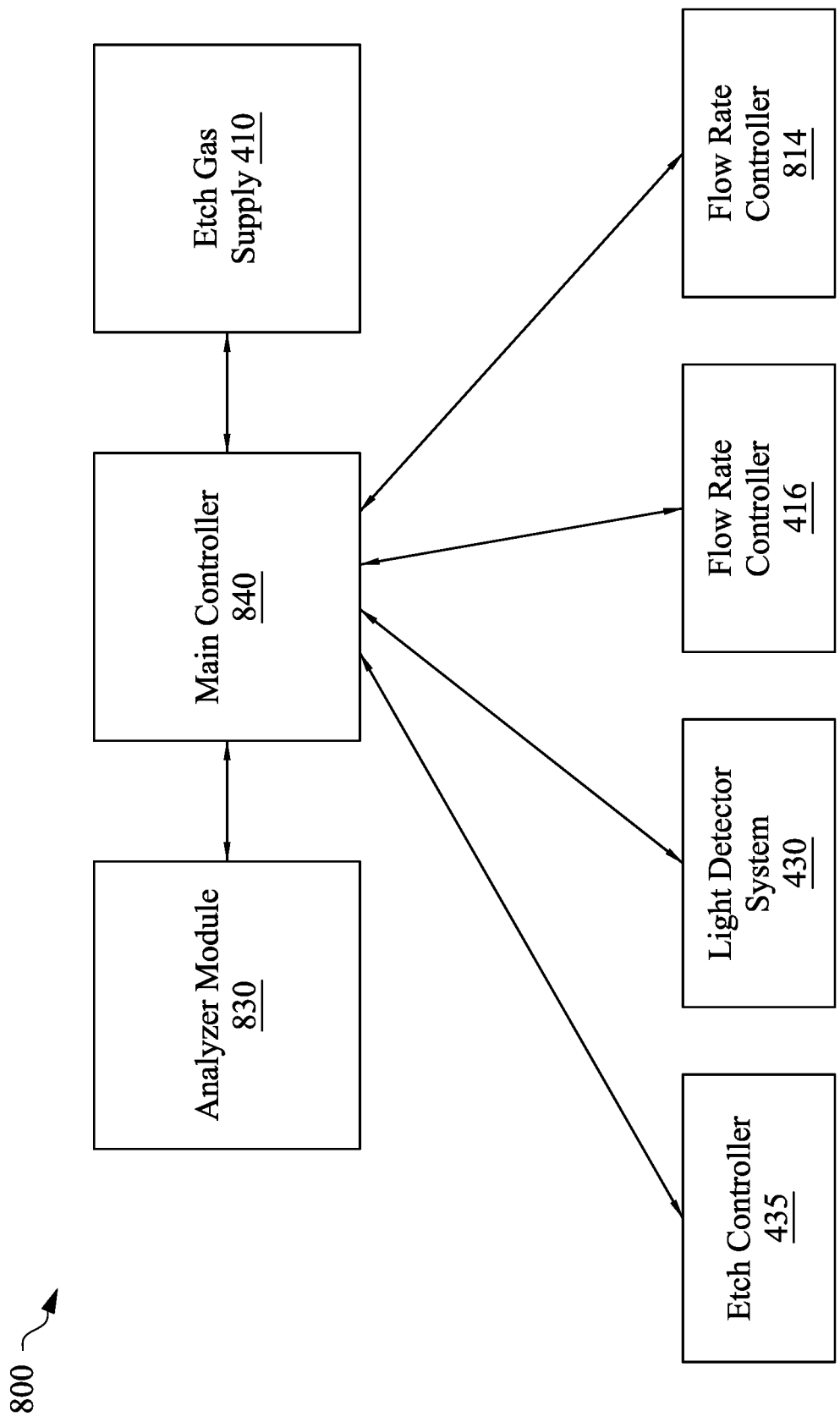
FIG. 8 shows a control system for calibrating a flow rate of a plasma etching system in accordance with some embodiments of the present disclosure.

FIG. 8 shows a control system 800 for calibrating a flow rate of a plasma etching system in accordance with some embodiments of the present disclosure. The control system 800 includes an analyzer module 830 and a main controller 840 coupled to each other. In some embodiments, the control system 800 includes the etch controller 435, the light detector system 430, the flow rate controller 416, and the flow rate controller 814 that is consistent with the adjustable valve 414 of FIG. 4A or 4B. In some embodiments, the analyzer module 830 is included in the etch controller 435. In some embodiments, the etch controller 435 or the analyzer module 830 included in the etch controller 435, directly controls the light detector system 430, the flow rate controller 416, the flow rate controller 814, and the etch gas supply 410. In some embodiments, the etch controller 435 or the analyzer module 830 included in the etch controller 435, controls the light detector system 430, the flow rate controller 416, the flow rate controller 814, and the etch gas supply 410 through the main controller 840.

In some embodiments, the analyzer module 830 performs the operation of setting the flow rate controller 416 to generate one or more first flow rates of an etching gas of the plasma beam generator 405 to generate one or more corresponding plasma beams. In some embodiments, as shown in FIGS. 8 and 4A, the analyzer module 830 performs the step of directing the plasma beam generator 405 to generate one or more plasma beams to the substrate 403 on the stage 404 of the plasma etcher 419. In some embodiments, as shown in FIGS. 4A and 8, the analyzer module 830 performs the step of receiving by the light detector system 430 emitted light 426 from plasma discharge of the plasma beams 412. In some embodiments, as shown in FIGS. 4A and 8, the analyzer module 830 performs the step of determining one or more second flow rates, corresponding with the one or more first flow rates of the etching gas of the plasma beam generator 405. In some embodiments, as shown in FIGS. 4A and 8, the analyzer module 830 performs the step of calibrating the flow rate controller 416 based on the one or more first flow rates and the corresponding one or more second flow rates.

Figure 9B:
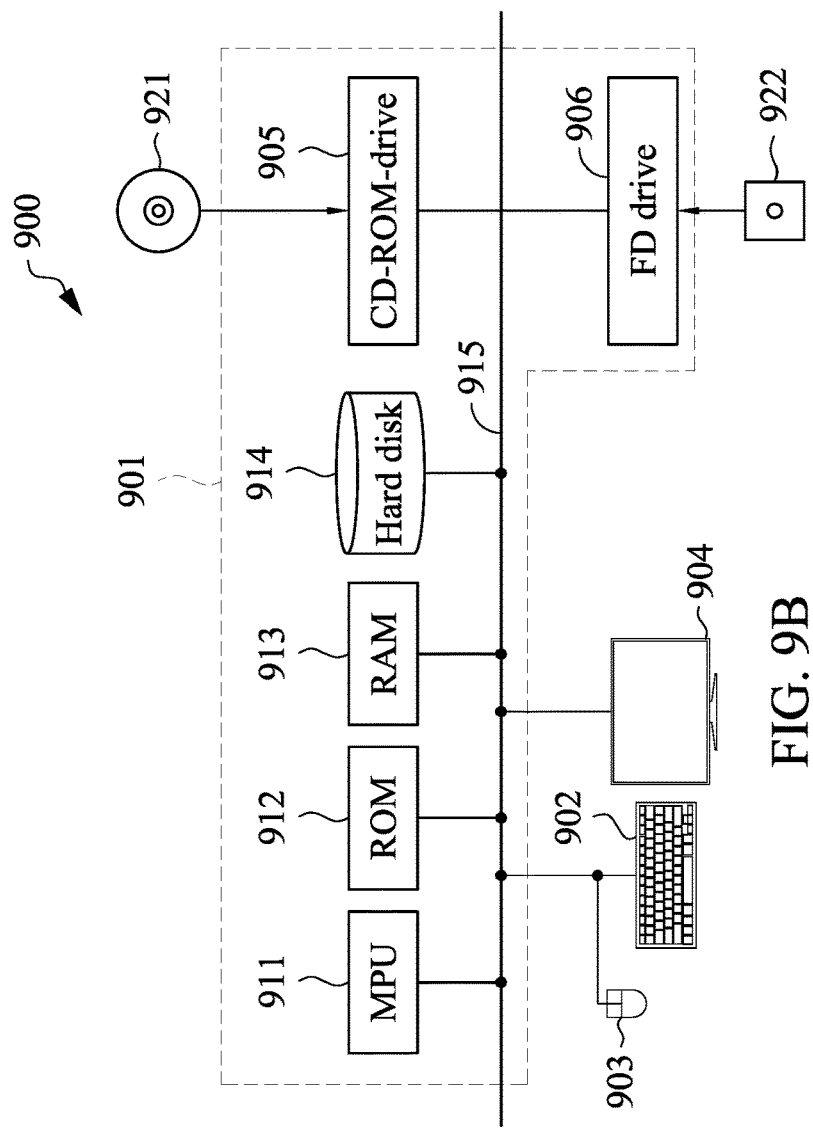
FIGS. 9A and 9B illustrate an apparatus for calibrating a flow rate of a plasma etching system in accordance with some embodiments of the present disclosure.
Figure 9A:
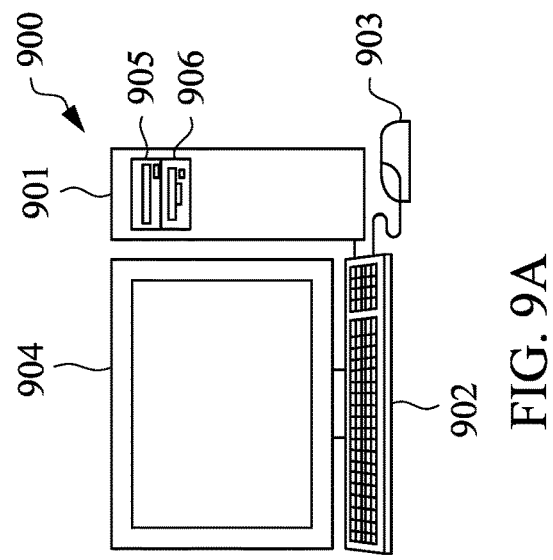

FIGS. 9A and 9B illustrate an apparatus for calibrating a flow rate of a plasma etching system in accordance with some embodiments of the present disclosure. In some embodiments, the computer system 900 is used for performing the functions of the modules of FIG. 8 that include the main controller 840, the analyzer module 830, the etch controller 435, the light detector system 430, the flow rate controller 416, the etch gas supply 410, and the flow rate controller 814. In some embodiments, the computer system 900 is used to execute the process 700 of FIG. 7.

FIG. 9A is a schematic view of a computer system that performs the functions of an apparatus for calibrating the flow rate of a plasma etching system. All of or a part of the processes, method and/or operations of the foregoing embodiments can be realized using computer hardware and computer programs executed thereon. In FIG. 9A, a computer system 900 is provided with a computer 901 including an optical disk read only memory (e.g., CD-ROM or DVD-ROM) drive 905 and a magnetic disk drive 906, a keyboard 902, a mouse 903, and a monitor 904.

FIG. 9B is a diagram showing an internal configuration of the computer system 900. In FIG. 9B, the computer 901 is provided with, in addition to the optical disk drive 905 and the magnetic disk drive 906, one or more processors, such as a micro processing unit (MPU) 911, a ROM 912 in which a program such as a boot up program is stored, a random access memory (RAM) 913 that is connected to the MPU 911 and in which a command of an application program is temporarily stored and a temporary storage area is provided, a hard disk 914 in which an application program, a system program, and data are stored, and a bus 915 that connects the MPU 911, the ROM 912, and the like. Note that the computer 901 may include a network card (not shown) for providing a connection to a LAN.

The program for causing the computer system 900 to execute the functions for calibrating a flow rate of a plasma etching system in the foregoing embodiments may be stored in an optical disk 921 or a magnetic disk 922, which are inserted into the optical disk drive 905 or the magnetic disk drive 906, and transmitted to the hard disk 914. Alternatively, the program may be transmitted via a network (not shown) to the computer 901 and stored in the hard disk 914. At the time of execution, the program is loaded into the RAM 913. The program may be loaded from the optical disk 921 or the magnetic disk 922, or directly from a network. The program does not necessarily have to include, for example, an operating system (OS) or a third party program to cause the computer 901 to execute the functions of the control system for calibrating a flow rate of a plasma etching system in the foregoing embodiments. The program may only include a command portion to call an appropriate function (module) in a controlled mode and obtain desired results.

According to some embodiments of the present disclosure, a method of manufacturing a semiconductor device includes setting a flow rate controller of a plasma etcher to generate one or more first flow rates of an etching gas corresponding to one or more plasma beams of a plasma etcher. The method also includes monitoring emitted light generated by plasma discharge corresponding to the one or more plasma beams of the plasma etcher. The method further includes calibrating the flow rate controller based on the one or more first flow rates and a corresponding emitted light of the plasma discharge. In an embodiment, the monitoring the emitted light from the plasma discharge further includes detecting an intensity of the emitted light from the plasma discharge at a characteristic wavelength of the etching gas. In an embodiment, the detecting the intensity of the emitted light from the plasma discharge at the characteristic wavelength of the etching gas includes transmitting the emitted light through an optical grating to diffract at least a portion of the emitted light to generate a beam of light at a first angle corresponding to the characteristic wavelength of the etching gas, and detecting an intensity of the beam of light at the first angle. The intensity of the beam of light at the first angle is the intensity of the emitted light from the plasma discharge at the characteristic wavelength of the etching gas versus a background signal related to a characteristic wavelength of a metal element. In an embodiment, the monitoring the emitted light from the plasma discharge is performed during plasma etching. The emitted light corresponds to the plasma discharge at a characteristic wavelength of an etched target layer. In an embodiment, the method further includes operating the plasma etcher with the calibrated flow rate controller. In an embodiment, the method further includes selecting two or more first flow rates with essentially equal flow rate difference between adjacent flow rates, fitting a linear curve between the two or more first flow rates and a corresponding detected emitted light of the plasma discharge, and calibrating the flow rate controller based on the one or more first flow rates and the second flow rates. In an embodiment, the etching gas includes one or a combination of $O_2$, $C_3F_8$, or $CH_3F$ and the metal element is nickel (Ni).

According to some embodiments of the present disclosure, a method of controlling a plasma beam of a plasma etcher includes directing one or more plasma beams to a first location of a semiconductor substrate inside an etching chamber of a plasma etcher. The method also includes setting a flow rate controller of the plasma etcher to generate one or more flow rates of an etching gas to generate the one or more plasma beam. The method further includes monitoring emitted light generated by plasma discharge at the first location of the semiconductor substrate, calibrating the flow rate controller based on the one or more flow rates and a corresponding detected emitted light generated by plasma discharge, and etching a via in the semiconductor substrate using a calibrated plasma beams. In an embodiment, the method further includes operating the plasma etcher with the calibrated flow rate controller, and plasma etching, with an accuracy of at least 1%, a structure of the semiconductor substrate with a critical dimension of 3 nm at the first location of the semiconductor substrate. In an embodiment, the monitoring the emitted light from the plasma discharge further includes receiving the emitted light from the plasma discharge, and detecting an intensity of the emitted light from the plasma discharge at a characteristic wavelength of the etching gas. In an embodiment, the monitoring the emitted light from the plasma discharge further includes transmitting the emitted light through an optical grating to diffract a first portion of the emitted light to generate a first beam of light at a first angle corresponding to a characteristic wavelength of the etching gas and to generate a second portion of the emitted light to generate a second beam of light at a second angle corresponding a background light related to a characteristic wavelength of nickel (Ni), and detecting an intensity of the first beam of light at the first angle and the second beam of light at the second angle. In an embodiment, the method further includes selecting two or more flow rates of the etching gas between 2.4 standard cubic centimeters per minute (sccm) and 3.6 sccm. In an embodiment, the two or more flow rates spans at least 90 percent of an entire range of the flow rate controller. In an embodiment, the method further includes performing optical emission spectroscopy (OES) to detect the emitted light generated by the plasma discharge.

According to some embodiments of the present disclosure, a system for controlling a plasma beam of a plasma etcher includes a main controller and a dry etching chamber that include a plasma etcher configured to generate a plasma beam, a stage configured to hold a substrate, and a flow rate controller coupled to the plasma etcher. The system further includes a light detector system coupled to the dry etching chamber and an analyzer module coupled to the main controller and to set the flow rate controller, via the main controller, to generate one or more flow rates of an etching gas of the plasma etcher to generate one or more corresponding plasma beams, to direct the plasma etcher, via the main controller, to generate the one or more plasma beams to the substrate on the stage of a dry etching chamber, to receive by the light detector system, via the main controller, emitted light from plasma discharge of the plasma beams, and to calibrate the flow rate controller based on the one or more flow rates and an emitted light from plasma discharge of corresponding plasma beam. In an embodiment, the light detector system is configured to detect the emitted light from the plasma discharge at a characteristic wavelength of the etching gas. In an embodiment, the light detector system comprises an optical grating to diffract the emitted light at a first angle corresponding to the characteristic wavelength of the etching gas. In an embodiment, the system further includes a high voltage source coupled to the plasma etcher and configured to generate the plasma beam. In an embodiment, the system further includes an etch gas supply, the flow rate controller is coupled between the etch gas supply and the plasma etcher, the flow rate controller is configured to adjust a flow rate of the etching gas that enters the plasma etcher.

In some embodiments, better control can be exerted when etching with a low intensity plasma beam. However, low intensity plasma beam requires low flow rates of etching gas. Implementing the processes and methods mentioned above increases the accuracy of providing low flow rates of etching gas for a plasma etcher and, thus, increase the accuracy of generating low intensity plasma beams by the plasma etcher.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device including a plasma process, comprising:
    setting a flow rate controller of a plasma etcher to generate one or more first flow rates of an etching gas corresponding to one or more plasma beams of the plasma etcher;
    monitoring emitted light generated by plasma discharge corresponding to the one or more plasma beams of the plasma etcher by:
        transmitting the emitted light through an optical grating to diffract at least a portion of the emitted light to generate a beam of light at a first angle corresponding to a characteristic wavelength of the etching gas; and
        detecting an intensity of the beam of light at the first angle, wherein the intensity of the beam of light at the first angle is the intensity of the emitted light from the plasma discharge at the characteristic wavelength of the etching gas versus a background signal related to a characteristic wavelength of a metal element; and
    calibrating the flow rate controller based on the one or more first flow rates and a corresponding emitted light of the plasma discharge.

2. The method of claim 1, wherein the monitoring the emitted A light from the plasma discharge is performed during plasma etching, and wherein the emitted light corresponds to the plasma discharge at a characteristic wavelength of an etched target layer.

3. The method of claim 1, further comprising:
    operating the plasma etcher with the calibrated flow rate controller.

4. The method of claim 1, further comprising:
    selecting two or more first flow rates with essentially equal flow rate difference between adjacent flow rates;
    fitting a linear curve between the two or more first flow rates and a corresponding detected emitted light of the plasma discharge; and
    calibrating an entire range of the flow rate controller based on the linear curve.

5. The method of claim 4, further comprising:
    determining, based on the emitted light from the plasma discharge, one or more second flow rates, corresponding with the one or more first flow rates of the etching gas of the plasma etcher; and
    calibrating the flow rate controller based on the one or more first flow rates and the one or more second flow rates.

6. The method of claim 1, wherein the etching gas includes one or a combination of $O_2$, $C_3F_8$, or $CH_3F$.

7. The method of claim 1, wherein the metal element is nickel (Ni).

8. A method of manufacturing a semiconductor device, comprising:
- directing one or more plasma beams to a first location of a semiconductor substrate inside an etching chamber of a plasma etcher;
- setting a flow rate controller of the plasma etcher to generate one or more flow rates of an etching gas to generate the one or more plasma beams;
- monitoring emitted light generated by plasma discharge at the first location of the semiconductor substrate by:
  - transmitting the emitted light through an optical grating to diffract a first portion of the emitted light to generate a first beam of light at a first angle corresponding to a characteristic wavelength of the etching gas and to generate a second portion of the emitted light to generate a second beam of light at a second angle corresponding a background light related to a characteristic wavelength of nickel (Ni); and
  - detecting an intensity of the first beam of light at the first angle and the second beam of light at the second angle;
- calibrating the flow rate controller based on the one or more flow rates and a corresponding detected emitted light generated by the plasma discharge; and
- etching a via in the semiconductor substrate using a calibrated one or more plasma beams.

9. The method of claim 8, further comprising:
operating the plasma etcher with the calibrated flow rate controller; and
plasma etching, with an accuracy of at least 1%, a structure of the semiconductor substrate with a critical dimension of 3 nm at the first location of the semiconductor substrate.

10. The method of claim 8, wherein the monitoring the emitted light from the plasma discharge further comprises:
receiving the emitted light from the plasma discharge; and
detecting an intensity of the emitted light from the plasma discharge at a characteristic wavelength of the etching gas.

11. The method of claim 8, further comprising:
selecting two or more flow rates of the etching gas between 2.4 standard cubic centimeters per minute (sccm) and 3.6 sccm.

12. The method of claim 11, wherein the two or more flow rates span at least 90 percent of an entire range of the flow rate controller.

13. The method of claim 8, further comprising:
performing optical emission spectroscopy (OES) to detect the emitted light generated by the plasma discharge.

14. A method of manufacturing a semiconductor device, comprising:
- calculating at least one etching gas flow rate of an etching gas to provide plasma to a substrate disposed in a chamber;
- detecting emitted light generated by plasma discharge at the substrate by:
  - transmitting the emitted light through an optical grating to diffract at least a portion of the emitted light to generate a beam of light at a first angle corresponding to a characteristic wavelength of the etching gas; and
  - detecting an intensity of the beam of light at the first angle, wherein the intensity of the beam of light at the first angle is the intensity of the emitted light from the plasma discharge at the characteristic wavelength of the etching gas versus a background signal related to a characteristic wavelength of a metal element;
- calibrating a flow rate controller based on the at least one etching gas flow rate and a corresponding detected emitted light generated by plasma discharge; and
- processing the substrate using a calibrated one or more beams of plasma.

15. The method of claim 14, wherein the calculating includes selecting two or more etching gas flow rates between 2.4 standard cubic centimeters per minute (sccm) and 3.6 sccm.

16. The method of claim 15, wherein the two or more etching gas flow rates span at least 90 percent of an entire range of the flow rate controller.

17. The method of claim 14, further comprising:
performing optical emission spectroscopy (OES) to detect the emitted light generated by the plasma discharge.

18. The method of claim 14, wherein the processing includes operating a plasma etcher with the calibrated flow rate controller.

19. The method of claim 14, wherein the metal element is nickel (Ni).

20. The method of claim 14, wherein processing the substrate includes etching a via in the substrate using the calibrated one or more beams of plasma.

* * * * *